United States Patent
Takamori et al.

(10) Patent No.: US 6,306,455 B1
(45) Date of Patent: *Oct. 23, 2001

(54) SUBSTRATE PROCESSING METHOD

(75) Inventors: Hideyuki Takamori, Kumamoto; Masafumi Nomura, Kumamoto-ken; Tsutae Omori, Yamanashi-ken, all of (JP)

(73) Assignee: Tokyo Electron Limited, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/141,721

(22) Filed: Aug. 27, 1998

(30) Foreign Application Priority Data

Aug. 27, 1997 (JP) .................................................. 9-231349
Nov. 18, 1997 (JP) .................................................. 9-332288

(51) Int. Cl.⁷ .............................. B05D 3/12; B05D 3/00; B05C 11/08
(52) U.S. Cl. .................................. 427/8; 427/9; 427/240; 118/52
(58) Field of Search .......................... 427/10, 9, 8, 240; 118/52

(56) References Cited

U.S. PATENT DOCUMENTS

| | | | |
|---|---|---|---|
| 4,889,069 | * 12/1989 | Kawakami | 118/50 |
| 5,127,362 | * 7/1992 | Iwatsu et al. | 118/667 |
| 5,143,552 | 9/1992 | Moriyama | 118/64 |
| 5,578,127 | * 11/1996 | Kimura | 118/695 |
| 5,695,817 | 12/1997 | Tateyama et al. | 427/240 |
| 5,718,763 | * 2/1998 | Tateyama et al. | 118/52 |
| 5,766,671 | * 6/1998 | Matsui | 427/8 |
| 5,885,353 | * 3/1999 | Strodtbeck et al. | 118/712 |

FOREIGN PATENT DOCUMENTS

| | | |
|---|---|---|
| 1-220826 | 9/1989 | (JP) . |
| 1-226150 | 9/1989 | (JP) . |
| 4-94525 | 3/1992 | (JP) . |

* cited by examiner

Primary Examiner—Shrive P. Beck
Assistant Examiner—Michael Cleveland
(74) Attorney, Agent, or Firm—Rader, Fishman & Grauer

(57) ABSTRACT

A method of processing a substrate for forming a coating film on a substrate comprising the steps of (a) mounting a substrate on a temperature controlling means which is capable of having a heat influence on the substrate, and controlling temperature of the substrate by the temperature controlling means, (b) controlling temperature of a coating solution to be supplied to the substrate, (c) controlling temperature of a contact member in contact with the substrate when the substrate is transported and held, (d) detecting temperature of an atmosphere of a process space for applying the coating solution to the substrate, (e) setting a desired temperature on the basis of temperature/film-thickness data previously obtained by forming the coating film on the substrate, (f) controlling a temperature controlling operation of at least step (c) on the basis of the desired temperature set in the step (e) and the temperature detected in the step (d), and (g) applying the coating solution to the substrate.

8 Claims, 20 Drawing Sheets

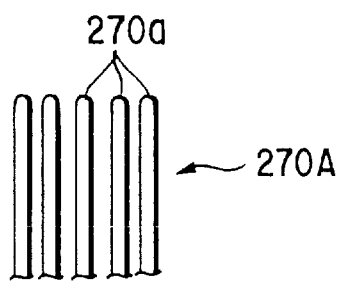
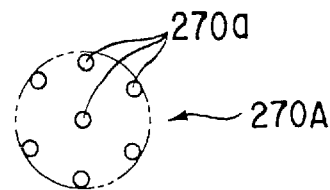
F I G. 6A    F I G. 6B
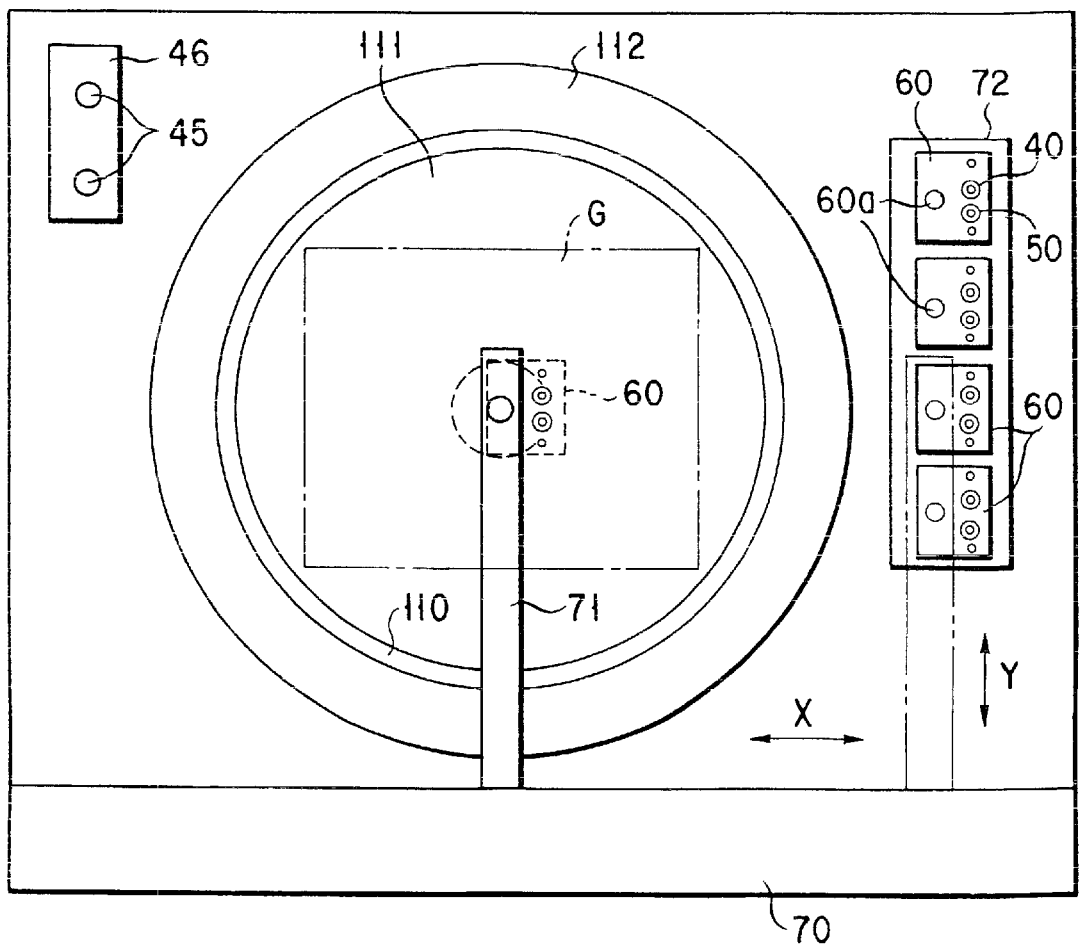
F I G. 9

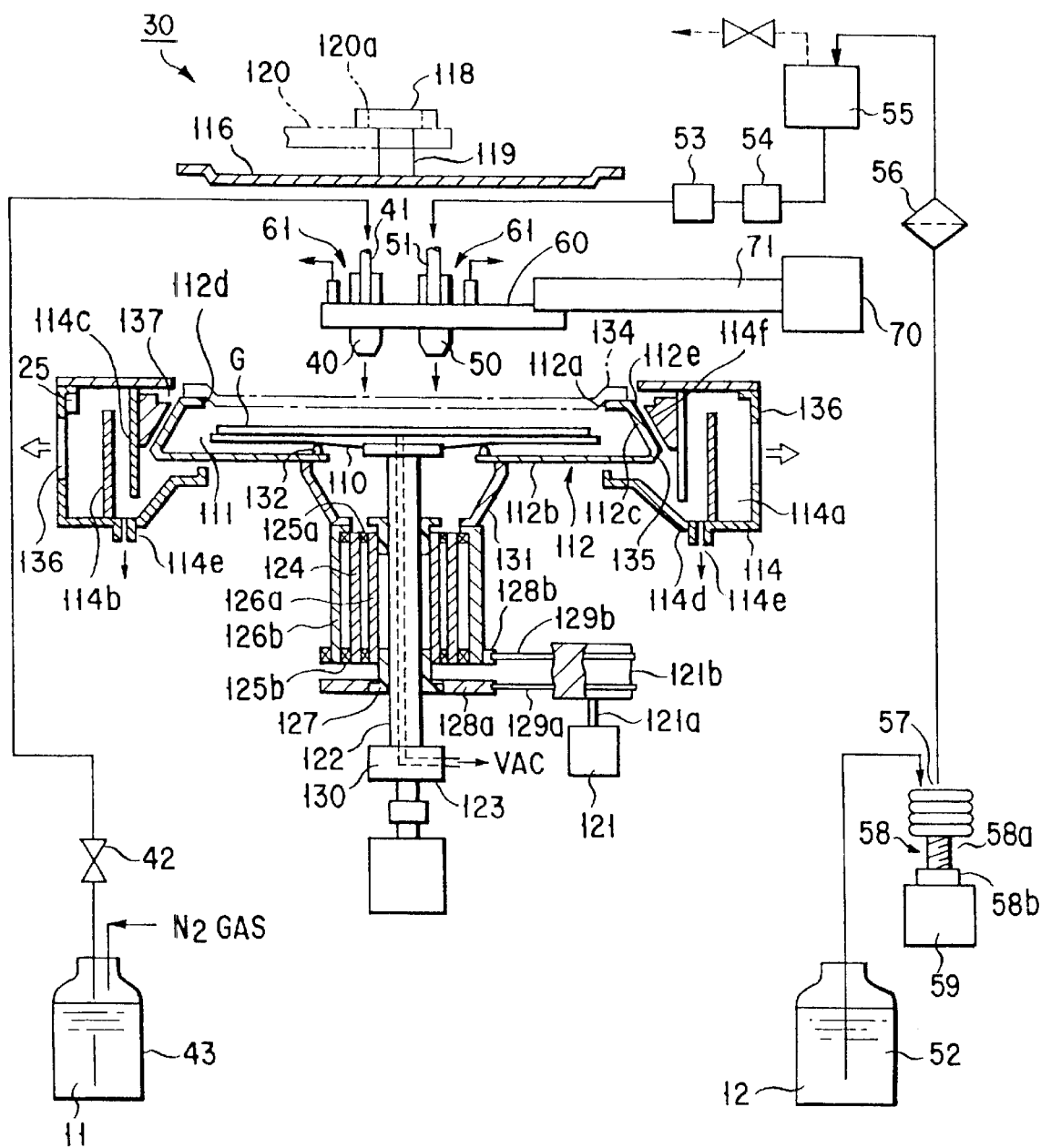
F I G. 8

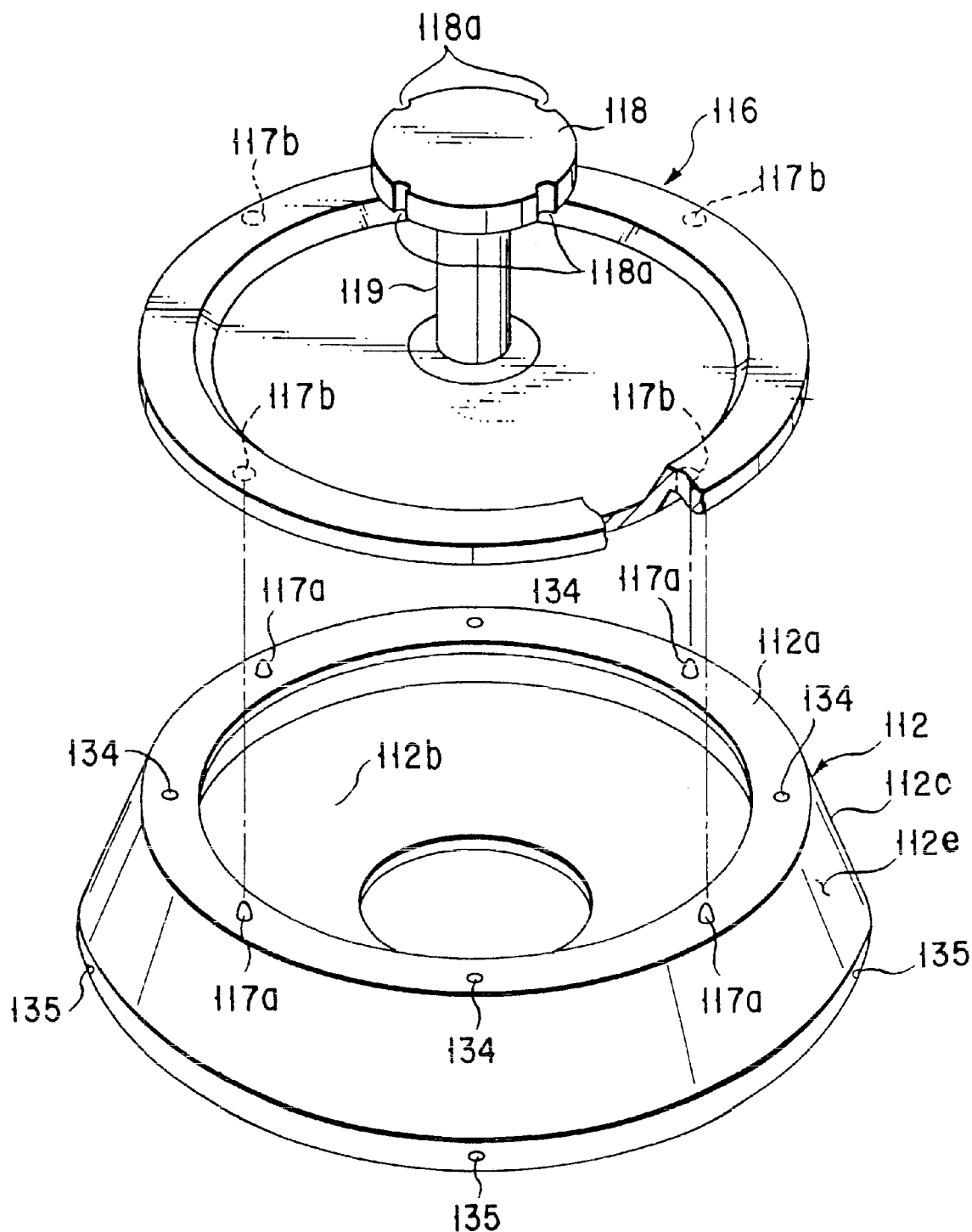
F I G. 11

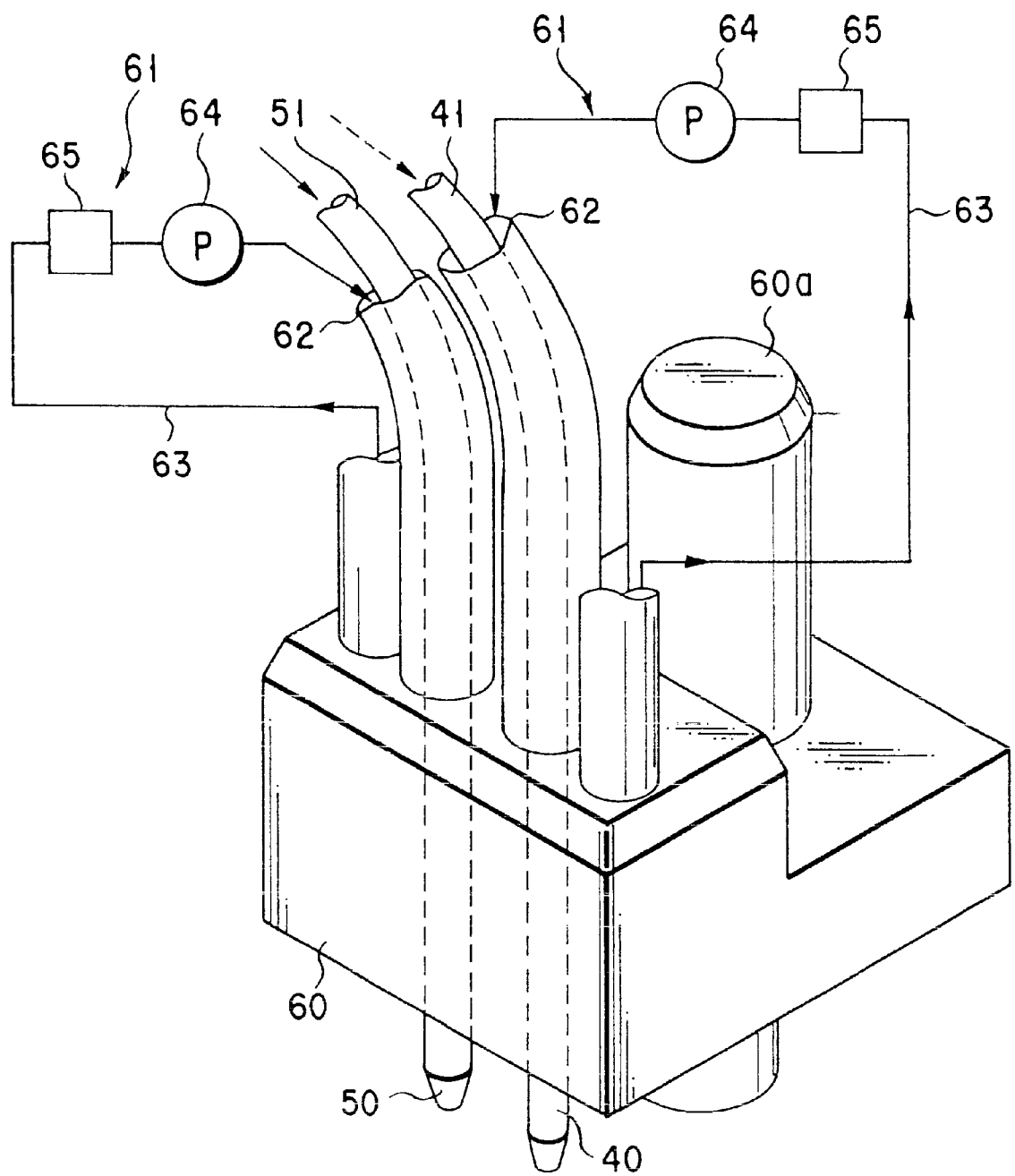
F I G. 12

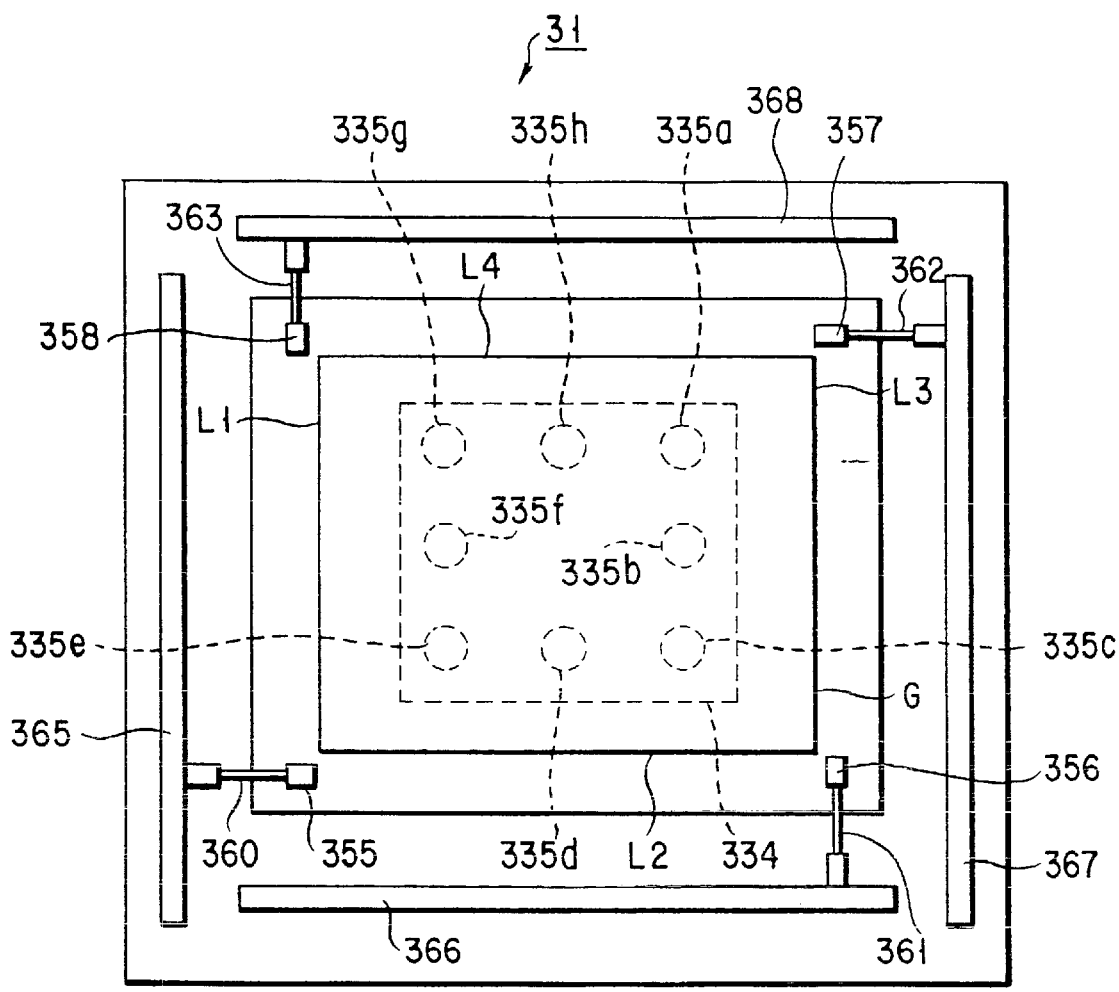
F I G. 14

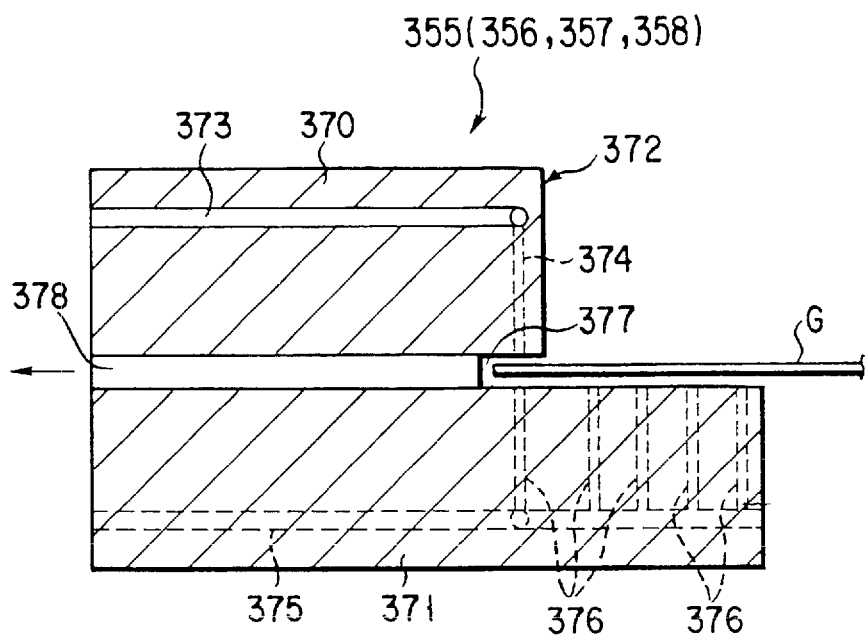
F I G. 15
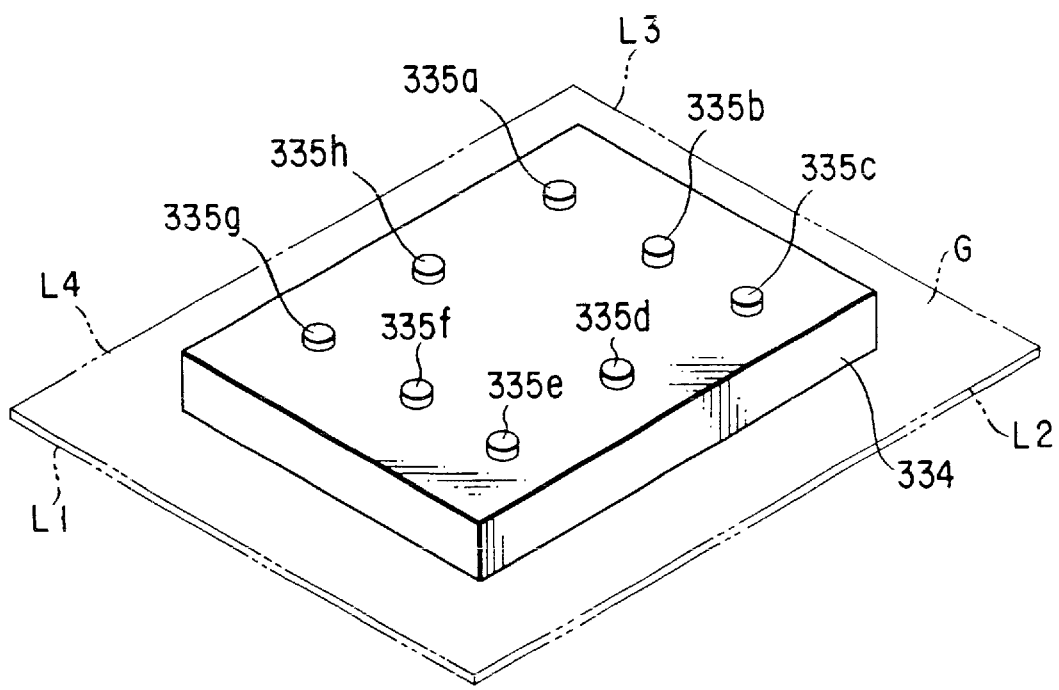
F I G. 16

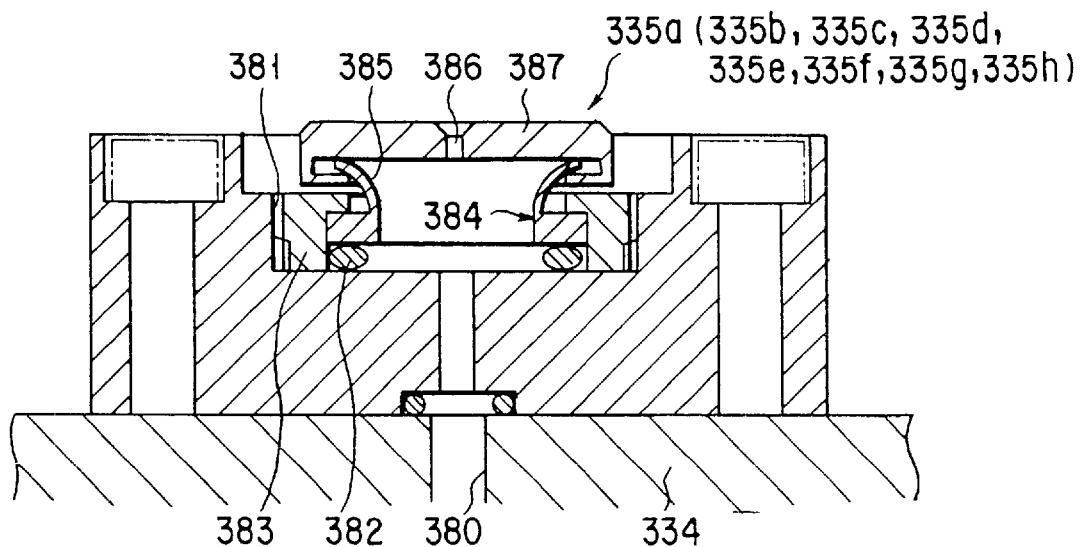
F I G. 17
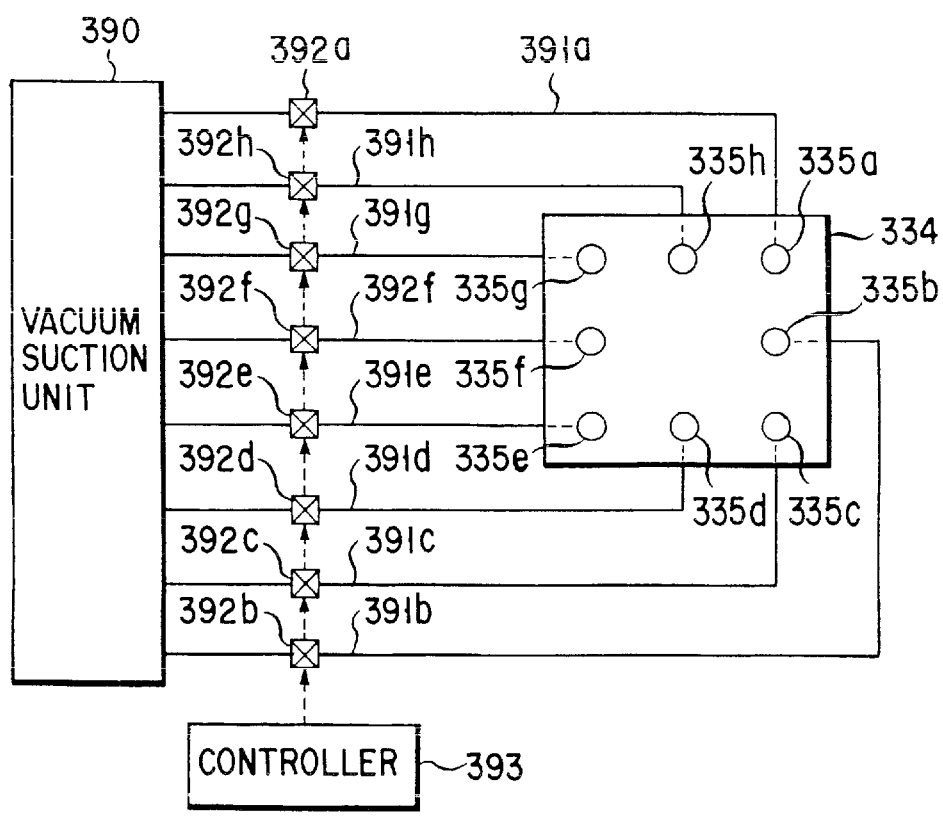
F I G. 18

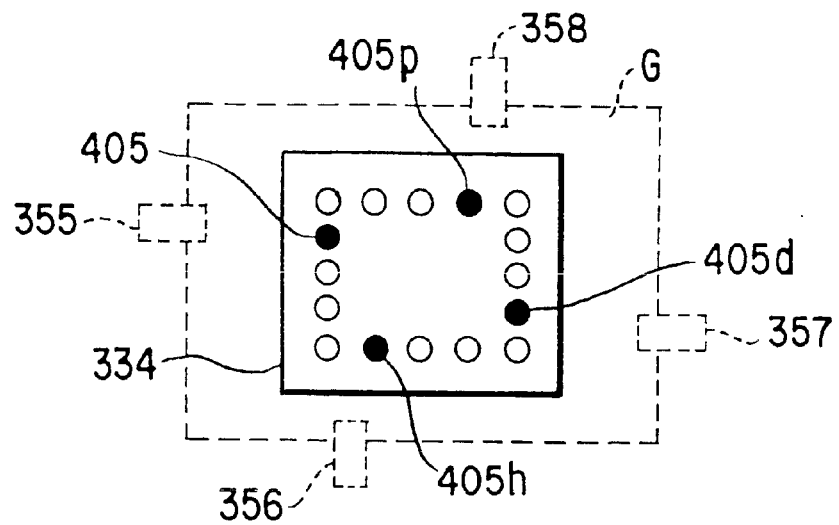
F I G. 24D
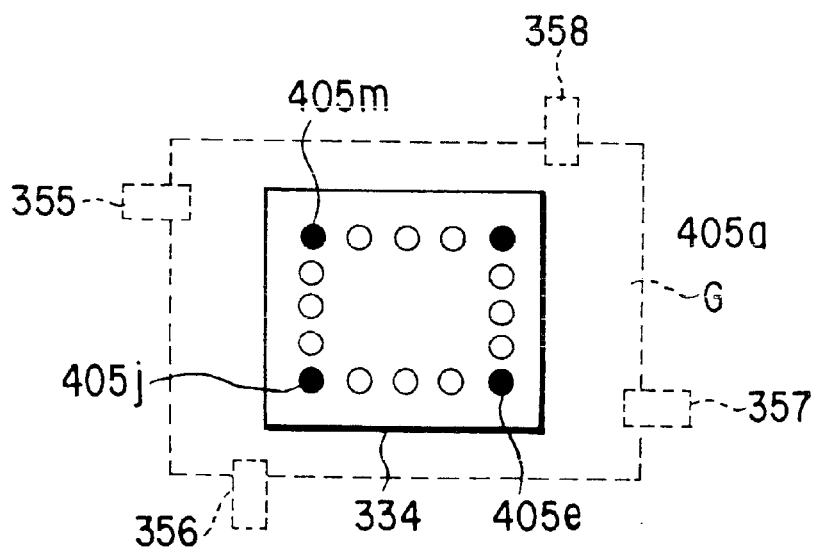
F I G. 24E

SUBSTRATE PROCESSING METHOD

BACKGROUND OF THE INVENTION

The present invention relates to a substrate processing method comprising applying a resist solution onto a large substrate such as a liquid crystal display (LCD) substrate and removing the coated resist from the peripheral edge portion of the substrate.

In a manufacturing process of the LCD substrate, a circuit pattern is formed on a glass substrate by a so-called photolithographic process. The photolithographic process including steps of drying a substrate, coating a resist solution on the substrate, exposing the coated resist film with a pattern, and developing the exposed resist film. In such a photolithographic process, it is important to maintain constant atmospheric temperatures of processing units. This is because quality of the coating resist film is strongly affected by the atmospheric temperature. For this reason, the substrate processing apparatus is placed in an air-conditioned clean room. Furthermore, the clean air of the air-conditioned clean room is introduced into the substrate processing apparatus, thereby adjusting processing temperature to a desired temperature (constant temperature) at the time the substrate is coated with a resist. In other words, the same clean air atmosphere as that of the clean room, whose temperature and humidity are controlled, is used as an inner atmosphere of the substrate processing apparatus. In this manner, the processing atmosphere in the coating unit for coating a resist on the substrate can be adjusted to the desired temperature (constant temperature). As a result, a resist film is formed in a film thickness controlled more accurately.

However, the atmosphere of the clean room varies depending upon various factors. Due to the influences of the various factors, the inner atmosphere (temperature and humidity) of the substrate processing apparatus changes. As a result, a resist film is formed in uneven thickness. In addition, the processing apparatus for the LCD substrate is large since the LCD substrate is larger than a semiconductor wafer. As a result, the atmosphere of the apparatus is not uniform in temperature and humidity. In other words, temperature and humidity of the atmosphere significantly differs depending upon sections of the apparatus. In particular, if the atmospheric temperature of the coating unit changes, the resultant resist film is formed in a thickness which deviates significantly from a desired value and formed in an extremely non-uniform thickness, producing a coating defect. Consequently, the yield of a final product tends to decrease.

The aforementioned temperature change of the atmosphere is one of reasons for the following phenomenon called "indirectly influenced mark". When a temperature change occurs between a contact member in contact with the substrate at its lower surface and the substrate when the substrate is processed or transported, the resist film formed on the upper surface of the substrate corresponding to the contact site by the contact member quantitatively and qualitatively differs from the resist film of the remainder portion.

In generally known methods, the photolithographic process is applied to a substrate horizontally fixed on a table or to a spinning substrate. In the case of the LCD substrate, the LCD substrate is adsorbed and held by a plurality of adsorption members provided on the upper surface of the table. More specifically, these adsorption members adsorb the rear surface of the substrate, thereby fixing the substrate on the table.

The table having adsorption members is used in a process of removing a coated resist from the peripheral edge surface of the substrate. In the process for removing a peripheral-edge resist, a solvent (e.g., thinner) is supplied to the peripheral edge portion of the substrate from a nozzle while moving the nozzle along the peripheral edge portion of the substrate adsorbed onto the table. In this case, the resist dissolved in the solvent is removed by vacuum-evacuation of the substrate peripheral edge portion. Note that the adsorption members keep adsorbing the rear surface of the substrate during the process.

In a conventionally-used apparatus, even if such a removal process is applied, the resist coating film formed on the upper surface of the substrate whose lower surface is adsorbed by the adsorption members differs in quantity and quality from that formed on the upper surface of the substrate whose rear surface is not adsorbed by the adsorption members. More specifically, marks are made on the surface of the substrate by indirect influence of the adsorption members attached on the rear surface (hereinafter referred to as "indirectly influenced mark"). The indirectly influenced mark of this type have a negative effect on the light-exposure processing and the developing performed in later steps. As a result, the yield of the final LCD product may decrease.

BRIEF SUMMARY OF THE INVENTION

An object of the present invention is to provide a substrate processing method capable of preventing occurrence of coating defects and "indirectly influenced mark".

According to the present invention, there is provided a method of processing a substrate for forming a coating film on a substrate comprising the steps of:

(a) mounting a substrate on a temperature controlling means which is capable of having a thermal influence on the substrate, and controlling temperature of the substrate by the temperature controlling means;

(b) controlling temperature of a coating solution to be supplied to the substrate;

(c) controlling temperature of a contact member in contact with the substrate when the substrate is transported or held;

(d) detecting temperature of an atmosphere of a process space for applying the coating solution to the substrate;

(e) setting a desired temperature for forming a coating film on a substrate;

(f) controlling a temperature controlling operation of at least step (c) on the basis of the desired temperature set in the step (e) and the temperature detected in the step (d); and (g) applying the coating solution to the substrate.

It is preferable that, in the step (g), the solvent controlled in temperature in the step (b) be applied to the substrate.

It is also preferable that, in the step (c), a spin chuck for rotatably holding the substrate be used as the contact member.

It is further preferable that, in the step (c), the process space surrounding the substrate mounted on the spin chuck be closed.

It is still preferable that, in the step (d), temperature of a fluid body flowing through a discharge passage be detected.

The method of the present invention is desirable to further comprise a step of setting temperature controlling conditions which provide a constant relationship between a temperature $T^T$ for the contact member in contact with the substrate, a temperature TH of the substrate, temperature $T^R$ of the coating solution, and a temperature $T^A$ of the atmosphere within the process space in a period from a previous step of applying the coating solution to the substrate until the coating film is cured.

As a result of intensive studies conducted by the present inventors, it was found that the "indirectly influenced mark" is likely to increase in size as the adsorption time of the substrate by the adsorption member gets longer. To describe more specifically, it is known that when a regional difference in temperature of the resist coating film formed on the substrate is 1.5° C. or more, the indirectly influenced mark is produced.

According to the present invention, it is possible to control temperature of each section of the process apparatus on the basis of an atmospheric temperature (detected temperature) of a process space and a desired temperature (preset temperature). Consequently, it is possible to prevent occurrence of coating defects and "indirectly influenced mark" before happening even if the temperature of the coating unit changes. In other words, temperatures of the substrate, the coating solution, the solvent, contact members (including a spin chuck, lift pins, and a transfer arm holder which are in direct contact with the substrate) are individually controlled. Therefore, influences from a temperature change of the external environment (clean room) can be overcome. As a result, the resist film can be formed in a more accurately controlled thickness. Simultaneously, the occurrence of the indirectly influenced mark is prevented.

According to the present invention, there is provided a method for processing a substrate for removing an unnecessary portion of a coating film formed on a substrate, comprising the steps:

(A) adsorbing and holding the substrate by a plurality of adsorption sites each being arranged along a corresponding peripheral side edge of an upper surface of a table;

(B) sucking and discharging a coating film dissolved in a solvent simultaneously with supplying the solvent to each of the substrate peripheral edge portions from a corresponding solvent nozzle while moving a plurality of solvent nozzles along the corresponding peripheral edge portions of the substrate; and (C) switching an adsorption maintaining operation to an adsorption canceling operation of the adsorption sites individually or in a unit of group, in at least the step (B).

According to aspects of the present invention, the adsorption time of each of adsorption sites can be reduced by switching operation of the adsorption sites in an on-off manner. Consequently, the occurrence of the indirectly influenced mark is prevented.

According to the present invention, the adsorption time of each of adsorption sites can be reduced by switching operation of the adsorption sites in an on-off manner. Therefore, the indirectly influenced mark is prevented by the switching operation.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 6A is a magnified plan view of a support pin of the cooling unit;

FIG. 6B is a magnified front view of the support pin of the cooling unit;

FIG. 8 is a detailed cross sectional view showing the resist coating apparatus with a block diagram of the peripheral elements;

FIG. 9 is a plan view showing the resist coating apparatus;

FIG. 11 is a perspective view showing a rotation cup of the resist coating apparatus;

FIG. 12 is a block perspective view showing a temperature controlling circuit of the resist coating apparatus;

FIG. 14 is a plan view showing the peripheral-resist removing apparatus;

FIG. 15 is a longitudinal sectional view showing a nozzle portion of the peripheral-resist removing apparatus;

FIG. 16 is a perspective view showing a substrate mounting table of the peripheral-resist removing apparatus;

FIG. 17 is a longitudinal sectional view showing a portion (adsorption site) of adsorbing and holding the substrate mounting table;

FIG. 18 is a block circuit diagram showing a exhausting circuit of the adsorption site;

FIGS. 24A, 24B, 24C, 24D, and 24E are schematic views showing switching movements of another adsorption site, respectively.

DETAILED DESCRIPTION OF THE INVENTION

Figure 1:
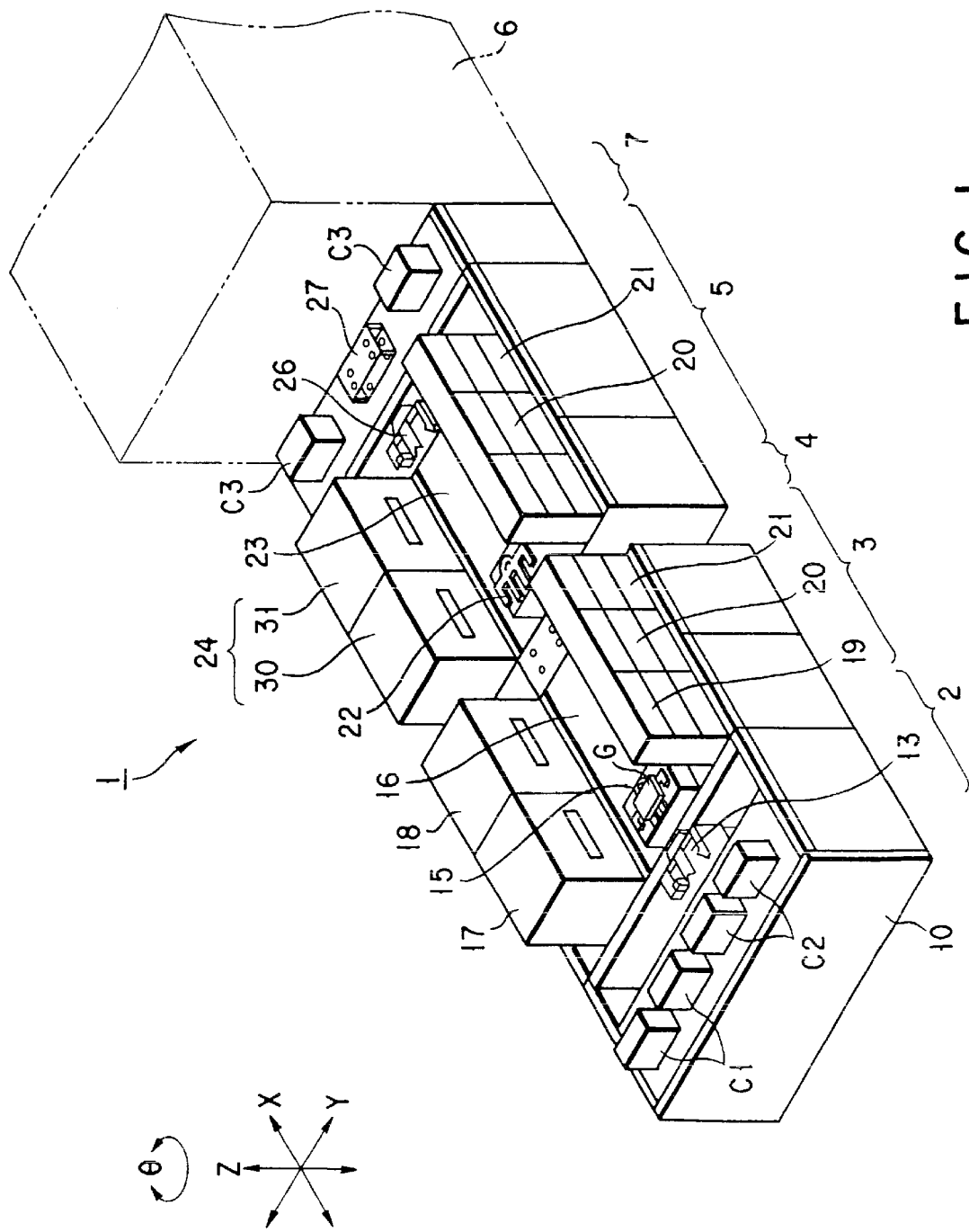
FIG. 1 is a perspective view of an entire coating/developing process system for an LCD substrate.

Now, preferable embodiments of the present invention will be explained with reference to the accompanying drawings.

The coating/developing process system 1 has a loader section 2 for loading and unloading cassettes C1 and C2, a first processing section 3 and a second processing section 5 for processing an LCD glass substrate G (hereinafter, referred to as "substrate G"), a first interface section 4 for mediating transferring the substrate G between the first processing section 3 and the second processing section 5, a second interface section 7 for mediating transferring the substrate G between the second processing section 5 and a light-exposing apparatus 6.

The loader section 2 is arranged at an end of the coating/developing process system 1 and has cassette station 10 and a first sub transfer arm 13. Cassette station 10 has a plurality of cassettes C1 and C2 mounted thereon. Cassette C1 stores unprocessed substrates G and a cassette C2 stores processed substrates G. The substrate G is a rectangular glass plate of e.g., 0.7 mm×800 mm×650 mm.

The first sub transfer arm 13 has a back-and-forth driving mechanism for moving a holder portion back and forth, a Y-axis driving mechanism for moving the holder portion in a Y-axis direction, a Z-axis driving mechanism for moving the holder portion in a Z-axis direction, and a θ-rotation driving mechanism for rotating the holder portion about the Z-axis. The first sub transfer arm 13 plays a role in unloading an unprocessed substrate G from cassette C1 and loading a processed substrate G into the cassette C2.

The first processing section 3 has a first main transfer arm 15 movable along a central transportation path 16, and a plurality of processing units 17, 18, 19, 20, 21 which are arranged side-by-side along both sides of the central transportation path. More specifically, a brush washing unit 17 and a developing unit 18 are arranged along one side of the transportation path 16. An adhesion unit 19, a baking unit 20, and a cooling unit 21 are arranged along the other side of the transportation path 16. Note that the adhesion unit 19, the baking unit 20 and the cooling unit 21 are stacked tandemly in multiple stages.

The second processing section 5 has a second main transfer arm 22 movable along a central transportation path 23 and a plurality of processing units 20, 21, 24 (30, 31) arranged side-by-side along both sides of the central transportation path 23. More specifically, a resist coating/peripheral resist portion removing unit 24 is arranged along one side of the transportation path 23. A baking unit 20 and a cooling unit 21 are arranged on the other side of the transportation path 23.

Each of the first and second main transfer arms 15 and 22 has a back and forth driving mechanism for moving the holder portion back and forth, an X-axis driving mechanism for moving the holder portion in the X-axis direction, a Z-axis driving mechanism for moving the holder portion in the Z-axis direction, and a θ-rotation driving mechanism for rotating the holder portion about the Z-axis. The first and second main transferring arms 15 and 22 play a role in loading/unloading the substrate G into/from each of the processing units 17, 18, 19, 20, 21, 24.

The interface section 7 has a cassette C3 for temporarily storing the substrate G on standby, a second sub transferring arm 26 for loading/unloading the substrate G into/from the cassette C3 and a deliver table 27 for passing the substrate G to the light-exposure apparatus 6.

Figure 2:
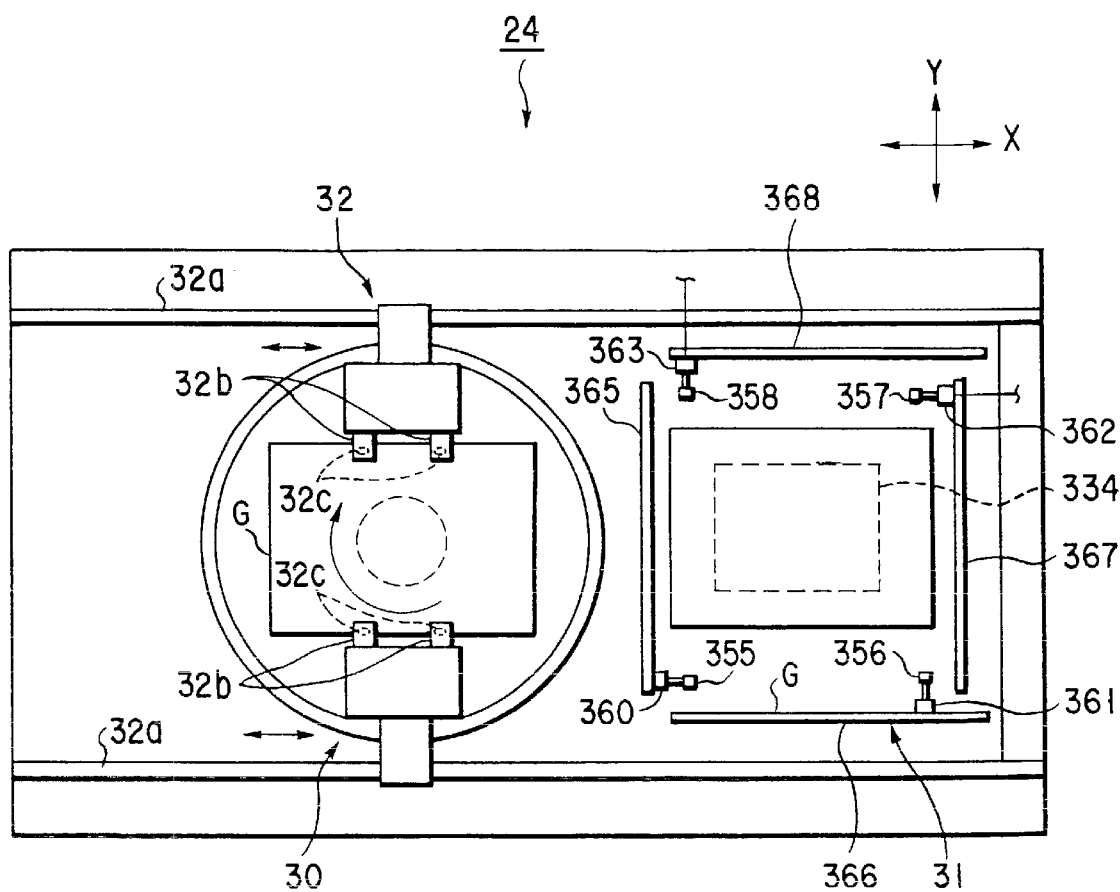
FIG. 2 is a plan view of a resist coating apparatus and a peripheral resist removing apparatus.

As shown in FIG. 2, the coating/peripheral resist portion removing unit 24 has a resist coating section (coating unit) 30 and a peripheral resist removing section 31 arranged side by side. The resist coating section 30 plays a role in coating a resist solution on a surface of the substrate G. The peripheral resist removing section 31 plays a role in removing a resist coating film from the peripheral edge portion of the substrate G. Parallel rails 32a are laid from one end to the other end of the coating/peripheral resist removing unit 24. The transfer mechanism 32 is designed to be moved along the parallel rails 32a in the X-axis direction. The transfer mechanism 32 has a pair of chucks 32b. The chucks 32b are designed to hold longer sides of the substrate G and transfer the substrate G from the resist coating section 30 toward the peripheral resist removing section 31. Note that a cooling element 32c is buried in each of the chucks 32b. The cooling elements 32c are responsible for cooling the chucks 32b. As the cooling element 32c, a Peltier element is used.

Now, referring to FIGS. 3, 4, 5, 6A, 6B, the cooling unit 21 will be explained.

Figure 4:
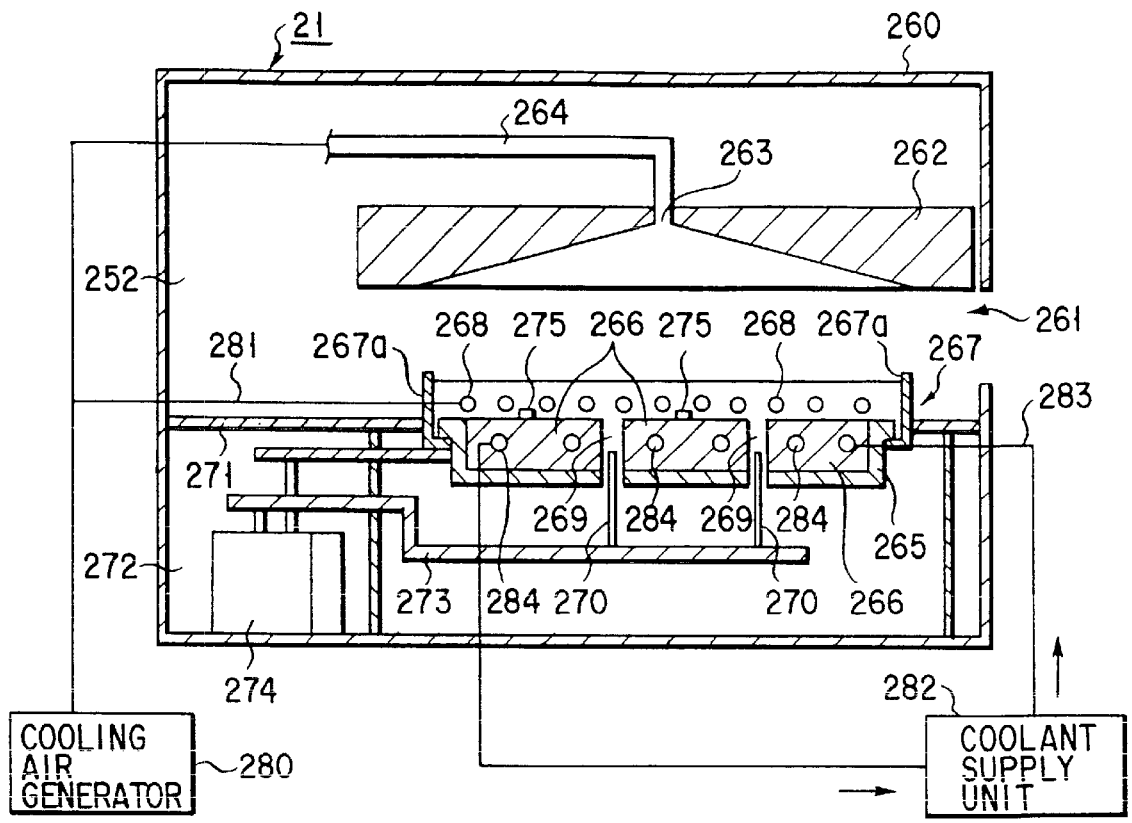
FIG. 4 is a cross-sectional view of the cooling unit with a block diagram of the peripheral elements.

As shown in FIG. 4, the exterior of the cooling unit 21 is covered with an exterior case 260 made of stainless steel. The cooling unit 21 has three cooling means consisting of an upper cooling mechanism 262, a middle cooling mechanism 267, and a lower cooling mechanism 265 in the case 260. The inside of the cooling unit 21 is divided by a partition 271 into two rooms: an upper room 252 and a lower room 272. The upper room 252 has an upper cooling mechanism 262. The middle cooling mechanism 267 and the lower cooling mechanism 265 are positioned at the boarder between the upper room 252 and the lower room 272.

A rectangular opening 261 is formed on one side surface of the exterior case 260. The substrate G is loaded/unloaded through the opening 261 into/from the upper room 252. The substrate G is moved from a holder 22a of the main transfer arm to lift pins 270 in the upper room 252. The substrate G is further moved from the lift pins 270 on supporting posts 275 of the cooling table 266. Note that a shutter for opening/closing the opening 261 may be provided on the cooling unit 20.

The upper cooling mechanism 262 is placed so as to face the middle cooling mechanism 267. The interval between the upper cooling mechanism 262 and the middle cooling mechanism 267 is set substantially equal to the width of the opening 261 in the vertical direction. On the lower surface of the upper cooling mechanism 262, a cooling air guiding portion 263 is formed for guiding cooling air toward the substrate G positioned below. A ventilation duct 264 extends from the center of the cooling air guiding portion 263 toward the peripheral portion. The ventilation duct 264 is communicated with the cool air generator 280. The ventilation duct 264 is introduced into the lower room 272 through the partition 271 and further connected to the cool air generator 280. In FIG. 4, the cool air generator 280 is illustrated outside the cooling unit 21, for convenience sake. Actually, the cool air generator 280 is positioned inside the lower room 272.

The middle cooling mechanism 267 has a frame member 267a having a plurality of holes 268 arranged at regular intervals. A pipe of the ventilation duct 281 is communicated with each of the holes 268. The ventilation duct 281 is communicated with the cool air generator 280. When cooling air is fed from the cool air generator 280 to the middle cooling mechanism 267 through the ventilation duct 281, the cooling air is simultaneously blown out from a plurality of holes 268, in the horizontal direction.

The lower cooling mechanism 265 is constituted of a table 266, a coolant supply source 282, and a circulation pipe 283. The table 266 has an inner flow passage 284. The coolant supply source 282 supplies a coolant to the inner flow passage 284 by way of the circulation pipe 283 in a circulation manner. As the coolant, for example, a liquid such as silicone oil is used. Since the table 266 is cooled by the lower cooling mechanism 265, the substrate G mounted on the table 266 is cooled.

A plurality of guiding holes 269 are vertically formed through the table 266. A lift pin 270 is provided within each of the guiding holes 269. All lift pins 270 are supported by a supporting arm 273, which is connected to a rod of a liftable cylinder 74. When the supporting arm 273 is moved up by projecting the rod from the liftable cylinder 274, the lift pins 270 are moved up from the table 266, accordingly.

Figure 5:
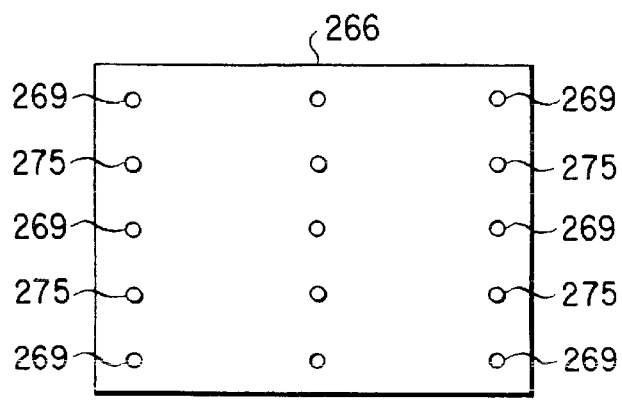
FIG. 5 is a plan view of a substrate mounting table of the cooling unit.

As shown in FIG. 5, nine guiding holes 269 are arranged in a grid form of 3 rows×3 lines in the table 266. Furthermore, each of six supporting posts 275 is arranged between adjacent guiding holes 269. As a material for the tip portions of the lift pin 270 and the supporting post 275, it is desired to employ a material having a low thermal transmission coefficient and rarely generating particles, such as a hard fluorine resin or ceramic. It is also desirable that the tip of the lift pin 270 be as thin as possible so as not to damage the substrate G. In other words, the contact area between the substrate G and the tip is rendered as small as possible. Note that a brush-type lift pin 270A consisting of seven filaments 270a may be employed, as shown in FIGS. 6A and 6B. In this case, since the contact area between the brush-type lift pins 270A and the substrate G can be further reduced, a regional temperature change of the coating film on the substrate G decreases. Since air for use in controlling temperature can be supplied to the substrate G through intervals between the filaments 270a, the temperature of the contact portion of the substrate G with the filaments 270a can be easily controlled.

Figure 3:
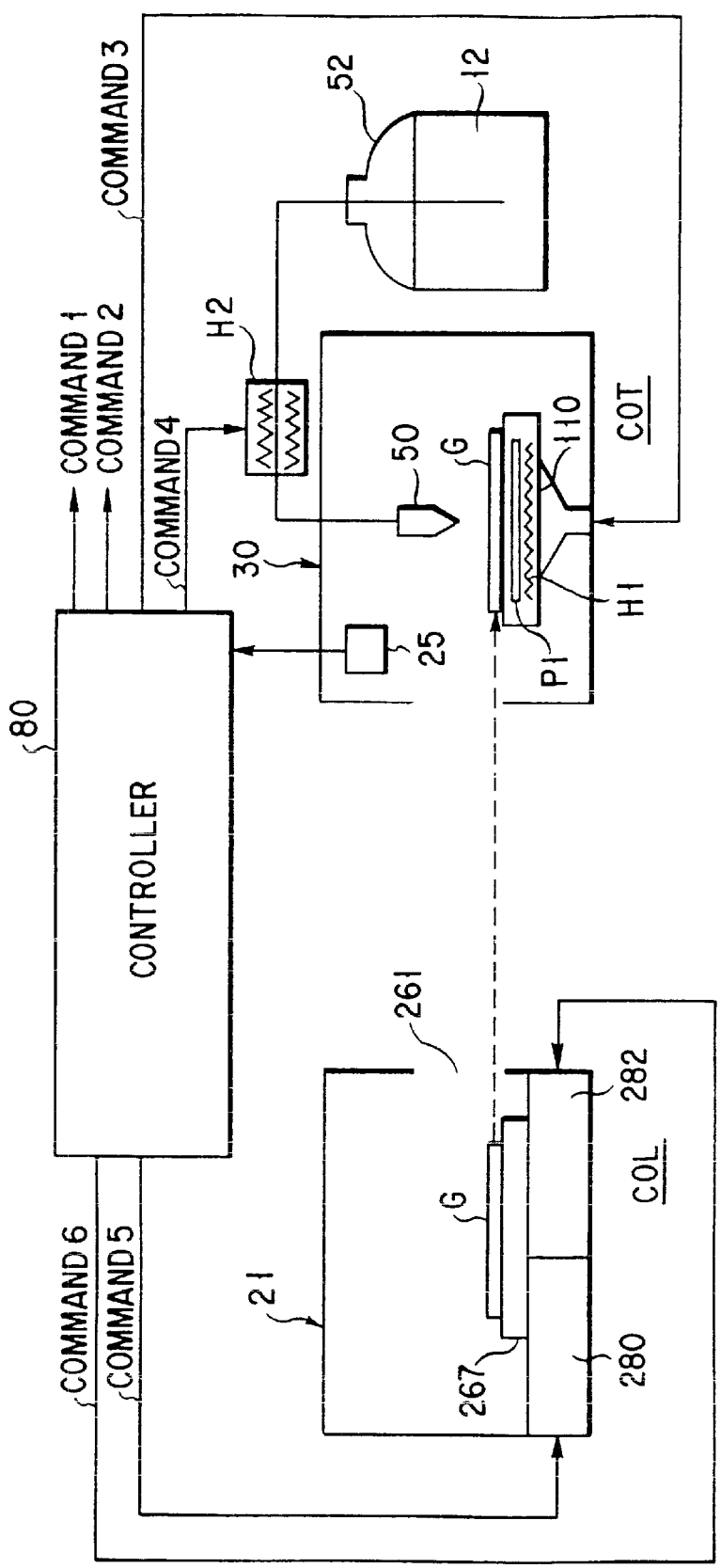
FIG. 3 is a schematic block diagram showing a circuit of a cooling processing section (cooling unit) of the resist coating apparatus.

As shown in FIG. 3, a temperature sensor 25 is provided in the coating unit (resist coating section) 30. The temperature sensor 25 detects an inner atmospheric temperature in the coating unit 30 and sends a temperature detection signal to an input side of the controller 80. The controller 80 sends commands 1 to 6 to each of a chuck heater H1, a chuck cooler (Peltier element) P1, a resist solution heater H2, the cool air generator 280, the coolant supply source 282, the cooling element 32c, and cooling air supply (not shown) for cooling the lift pins 270, 270A, 530 to control the operation thereof. The chuck heater H1 controls a spin chuck 110 in temperature by heating it. The chuck cooler P1 controls the spin chuck 110 in temperature by cooling it. The resist-solution heater H2 controls the temperature of the resist solution to be supplied to a nozzle 50 by heating it. In the meantime, as shown in FIG. 8, the temperature sensor 25 is desirably provided within a ring-form passage 114a which is free from the receipt of scattered processing solutions 11, 12.

Figure 7:
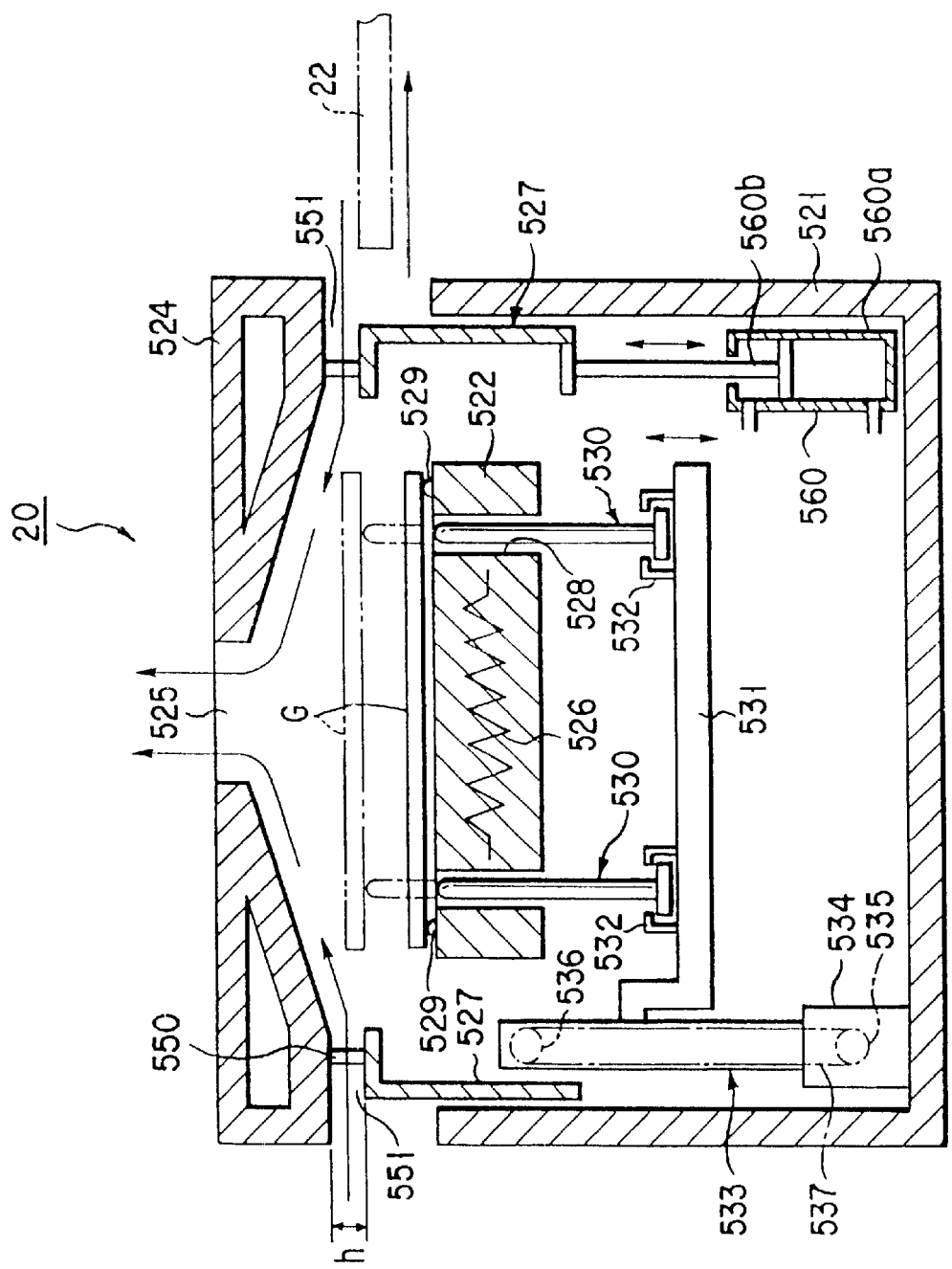
FIG. 7 is a sectional view of a baking unit.

Referring now to FIG. 7, the baking unit 20 will be explained. The baking unit 20 has a chamber 521, a table 522, a cover member 524, a shutter 527, a plurality of supporting pins 530, a pin liftable mechanism 533, and a shutter liftable mechanism 560. A slit 551 is formed between the chamber 521 and the cover member 524. The substrate G is loaded into and unloaded from the chamber 521 by means of the transfer arm 22 through the slit 551. An opening 525 is formed at the center of the cover member 524. Air enters a through a ring-form slit 551 into the chamber 521 and comes out from the chamber 521 by way of the opening 525.

The shutter 527 is liftably supported by the liftable mechanism 560. When a rod 560b is allowed to protrude from a cylinder 560a of the liftable mechanism 560, the shutter 527 moves up to shut the slit 551. Conversely, when the rod 560b is withdrawn into the cylinder 560a, the shutter descends to open the slit 551. Note that reference numeral 550 is a stopper for limiting stroke of the shutter during the moving-up operation.

A heater 526 is embedded in the table 522. The power source of the heater 526 is controlled by a controller 80. A plurality of supporting pads 529 are formed in an upper periphery of the table 522. The substrate G is supported by the supporting pads 529. A plurality of through-holes 528 are formed in the table 522. A supporting pin 530 is passed through each of the through-holes 528. The supporting pins 530 are supported by a movable supporting plate 531. The movable supporting plate 531 is further liftably supported by the pin liftable mechanism 533. The lower portion of each of the supporting pins 530 is held loose by a holding member 532 movably in the horizontal direction.

A tip portion of the supporting pin 530 is formed of a resin material having a small heat transfer coefficient and rarely generating particles. Note that the supporting pins 530 may be an assembly of small-diameter pins 270a as shown in FIGS. 6A and 6B. Since each of such small-diameter pins 270 has a small heat capacity, the thermal effect upon the substrate G is small. The pin 270a can be easily controlled at an appropriate temperature by supplying a heat-exchange fluid body (e.g. conditioning air) among the adjacent small-diameter pins.

The pin liftable mechanism 533 has a stepping motor 534, a driving pulley 535, a follower pulley 536 and a timing belt 537. A movable supporting plate 531 is connected to the belt 537. When the motor 534 is driven, the belt 537 is moved up together with the movable supporting plate 531. Furthermore, the supporting pins 530 protrude from or withdrawn into the table 522.

Next, the resist coating section (coating unit) will be explained with reference to FIGS. 8 to 18.

As shown in FIGS. 8 and 9, the resist coating apparatus is constituted of a spin chuck 110, a rotation cup 112, a cover 116, a robot arm 120, a drain cup 114, a driving motor 121, a shower head 60, and a moving mechanism 70. The spin chuck 110 holds the substrate G horizontally and rotatably by vacuum adsorption. The rotation cup 112 (upper portion is opened) includes a process chamber 111 enclosing upper and outer peripheral portions of the spin chuck 110. The cover 116 is detachably provided at the cup 112, for covering an opening portion 112a of the rotation cup 112. The robot arm 120 moves the cover 116 between a termination position and a standby position. The drain cup 114 is a hollow-ring arranged so as to surround the outer periphery of the rotation cup 112. The driving motor 121 rotates the spin chuck 110 and the rotation cup 112. The shower head 60 is movably provided above the spin chuck 110. The moving mechanism 70 holds the shower head 60 and moves it between a shower head standby position and the position above the substrate. The shower head 60 has a solvent supply nozzle 40 for supplying a solvent (thinner) 11 and a resist solution supply nozzle 50 for supplying a resist solution 12. Note that the temperature sensor 25 is desirably provided within an exhausting passage 114 which is free from the receipt of scattered processing solutions 11, 12 in the cups 112, 114.

As shown in FIG. 12, each of the solvent supply passage and the resist solution supply passage respectively extending from nozzles 40 and 50 has a temperature control mechanism 61. The temperature control mechanism 61 circulates a temperature control solution (temperature control water) in order to set the solvent 11 and the resist solution 12 at a predetermined desired temperature (e.g., 23° C.).

The spin chuck 110 is, for example, formed of a heat-resistant synthetic resin such as polyether etherketone (PEEK). The spin chuck 110 is rotatable in the horizontal direction by means of a rotation shaft 122 rotated by a driving motor 121. The rotation speed of the rotation shaft 112 can be changed. Furthermore, the spin chuck 110 is movable vertically by means of the liftable cylinder 123 which is connected to the rotation shaft 122. The spin chuck 110 is larger than the substrate G. The spin chuck 110 has temperature control mechanisms H1, P1 buried therein. These temperature control mechanisms are responsible for controlling temperature of the substrate G held on the spin chuck 110, swiftly and uniformly.

Figure 10:
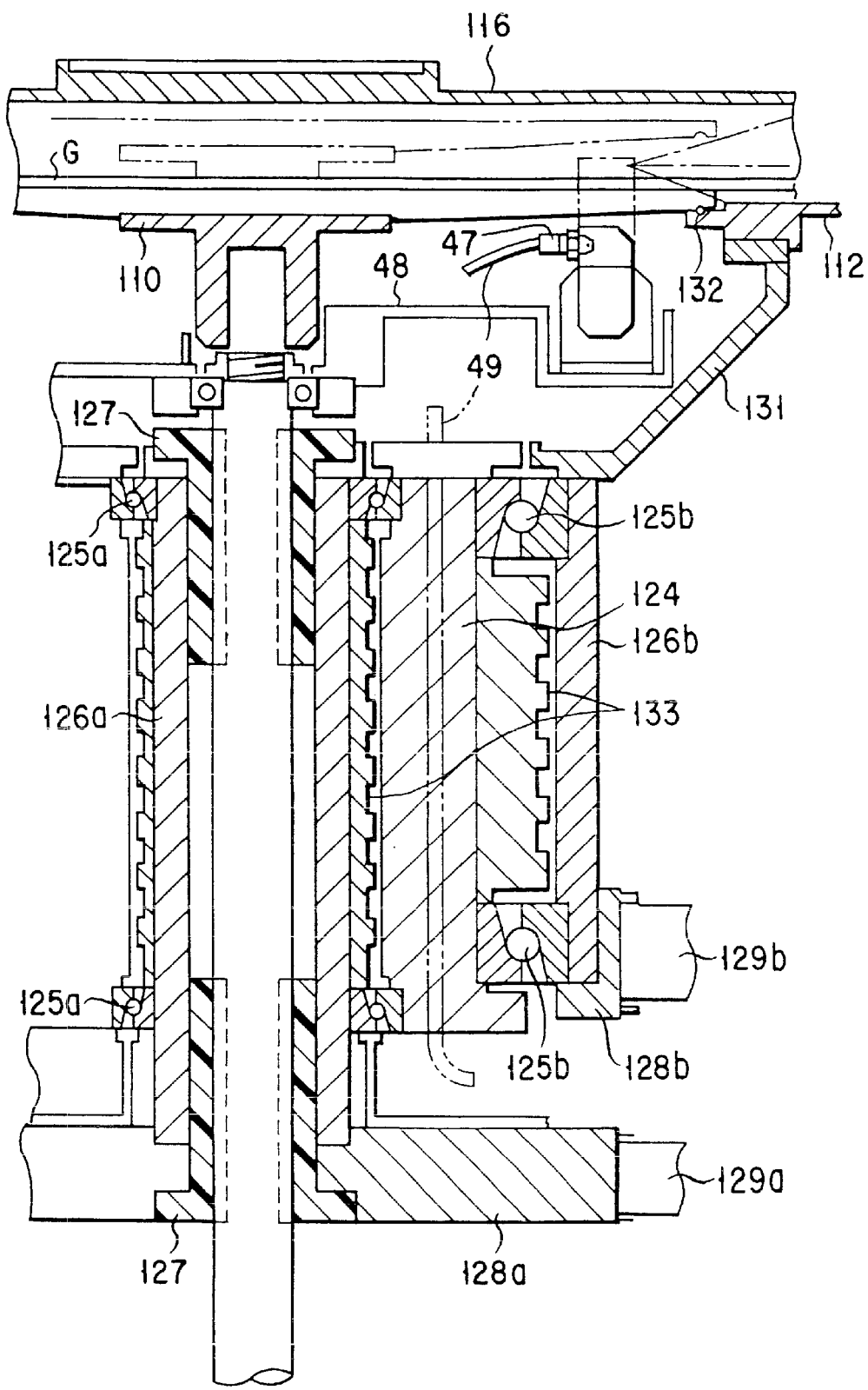
FIG. 10 is a magnified longitudinal cross-sectional view of a driving section of the resist coating apparatus.

As shown in FIG. 10, the rotation shaft 122 is slidably provided at a spline bearing 127. The spline bearing 127 is fitted on an inner peripheral surface of a rotatable cylinder 126a. The rotatable cylinder 126a is rotatably attached to the inner peripheral surface of a fixed collar 124 via a bearing 125a. The spline bearing 127 is equipped with a follower pulley 128a. A belt 129a is stretched between the follower pulley 128a and a driving pulley 121b. The driving pulley 121b is attached to a driving axis 121a of the driving motor 121. Hence, when the belt 129a is driven by the driving motor 121, the rotation shaft 122 is driven to rotate the spin chuck 110. The lower portion of the rotation shaft 122 is arranged inside a cylinder (not shown). The rotation shaft 122 is connected to the liftable cylinder 123 via a vacuum sealing portion 130 in the cylinder. Therefore, the rotation shaft 122 can be moved up and down by the movement of the liftable cylinder 123. As a result, the spin chuck moves up and down. Although the substrate G is held by the spin chuck 110 through vacuum adsorption herein, the substrate G may be held by the following way. A plurality of supporting arms 110a are allowed to extend toward outside of the spin chuck and a fixing pin 110b is allowed to project upwardly from each of tip portions. Using the fitting pins 110b, the substrate G is held at corners.

A connection cylinder 131 is fixed on an upper end portion of a rotatable outer cylinder 126b fitted on the outer peripheral surface of the fixed collar 124 with a bearing 125b interposed therebetween. The rotation cup 112 is attached via the connection cylinder 131. A bearing 132 having a sealing function is interposed between a bottom portion 112b of the rotation cup 112 and a lower surface of the spin chuck 110. Therefore, the rotation cup 112 can be rotated relative to the spin chuck 110. A follower pulley 128b is attached to the rotatable outer cylinder 126b. A belt 129b is stretched between the follower pulley 128b and the driving pulley 121b attached to the driving motor 121. Since a driving force is transmitted from the driving motor 121 to the rotation cup 112 by means of the belt 129b, the rotation cup 112 is rotated.

As shown in FIGS. 8 and 10, the follower pulley 128b is equal in diameter to the follower pulley 128a which is attached to the rotation shaft 122. The belts 129a and 129b are stretched over the same driving motor 121. Hence, the rotation cup 112 and the spin chuck 110 can be rotated at the same speed. Note that, as shown in FIG. 10, labyrinth sealing portions 133 are formed at the fixed collar 124 facing the rotatable inner cylinder 126a and the rotatable outer cylinder 126b. By virtue of this, it is possible to prevent particles from being introduced into the rotation cup 112 from the lower driving system during the processing while rotating.

As shown in FIG. 11, the rotation cup 112 has a side wall 112c which is upwardly reduced in diameter. The side wall 112c is inclined to make a taper surface 112e. A flange 112d is provided inwardly at the upper end of the side wall 112c. Air intake ports 134 are formed at appropriate intervals around the inwardly provided flange 112d of the rotation cup 112. Air exhaust ports 135 are formed at appropriate positions around the lower peripheral portion through the side wall 112c. Since the air intake ports 134 and air exhaust ports are provided in this fashion, air comes into the process chamber 111 from the air intake port 134 and flows out from the air exhaust hole 135. It is therefore possible to prevent the process chamber 111 from turning into a negative pressure while the rotation cup 112 is rotated, and to remove (open) the cover 116 easily from the rotation cup 112 without application of large force.

On the other hand, a ring-form passage 114a is provided within the drain cup 114. Exhaust holes 136 are formed at appropriate positions (e.g. four positions in the periphery) around the outer peripheral wall of the drain cup 114. The exhaust ports 136 are communicated with an exhaust apparatus (not shown). The ring-form passage 114a and radially arranged exhaust passages 137 communicating with the exhaust ports 136 are formed along the upper inner periphery of the drain cup 114 (see FIG. 8). As described, since the exhaust ports 136 are formed in the outer periphery of the drain cup 114 and the exhaust passages 137 are formed along the upper inner periphery, it is therefore possible to prevent mist, which has been introduced into the drain cup 114 by way of exhaust ports 134, from being moved upwardly toward the upper side of the rotation cup 112. In this manner, the mist is successfully discharged outside by way of the exhaust ports 136.

The ring-form passage 114a is partitioned by an outer wall 114b rising up from the bottom of the drain cup 114 and by an inner wall 114c hanging down from the ceiling of the drain cup 114. Since the detour is formed by these partitions, air can be exhausted uniformly. In addition, drain holes 114e are formed at regular intervals in the periphery of the bottom portion 114d located between the outer wall 114b and the inner wall 114c.

The inner peripheral surface of the drain cup 114 is inclined to form a taper surface 114f which corresponds to the taper surface 112e of the rotation cup 112. An extremely thin slit is formed between the taper surface 112e of the rotation cup 112 and the taper surface 114f of the drain cup 114. Since the extremely thin slit of a downwardly-spread taper form is formed, a pressure difference is induced due to difference in rotation speed between the upper and the lower portions of the thin slit at the time the rotation cup 112 is rotated. The pressure difference facilitates air-flow flowing from the upper side toward the lower side of the thin slit of the outer periphery of the rotation cup 112, thereby exhausting mist within the drain cup 114 from being scattered outside of the rotation cup 112 by way of the thin slit.

Even in the case where the mist rises through the thin slit and is going to be scattered outside of the rotation cup 112, it is possible for the mist to be successfully discharged from the exhaust ports 136 by way of the exhaust passage 137 and the ring-form passage 114a of the drain cup 114.

In this embodiment, we have explained the case where the drain cup 114 is positioned so as to surround the outer periphery of the rotation cup 112. It is not necessary for the drain cup 114 to be positioned in the outer periphery of the rotation cup 112 and may be positioned at the lower portion of the rotation cup 112.

The cover 116 must be fixed at the opening portion 112a of the rotation cup 112 and rotated together during the rotation process. Then, the cover 116 is fixed at the rotation cup 112 by engaging fixing pins 117a, which protrudes from the upper portion of the rotation cup 112, with fitting recesses 117b corresponding to the fixing pins 117a. In this case, the top portions of the fixing pins 117a are formed round to reduce dust which will be generated when the pin 117a is in touch with the fitting recesses 117b. It is not necessary for the fixing pins 117a to protrude toward the rotation cup. The fixing pins 117a may be protruded toward the cover while the fitting recesses 117 are formed on the rotation cup. Alternatively, the fitting recesses 117b may be connected to a suction device (not shown) to vacuum out the dust generated when the fitting recesses 117b are in contact with the fixing pins 117a.

A supporting member 119 extends upwardly from the center of the upper surface of the cover 116. To the upper end of the supporting member 119, a head 118 is formed which is larger in diameter than the supporting member 119. The cover is open and closed by inserting a robot arm 120 into the lower portion of the head 118 (provided on the upper surface of the cover 116) by use of the supporting member 119, engaging an engaging pin 120a (protruding from the robot arm 120) with an engaging groove 118a (formed in the head 118, see FIG. 11), and moving the robot arm 120 up and down.

The engaging groove 118a of the head 118 and engaging pin 120a of the robot arm 120 (when the cover 116 is opened) and the fixing pins 117a and the fitting recesses 117b (when the cover 116 is closed) are aligned with each other by controlling a rotation angle of the driving motor 121 consisting of a servo motor.

In this embodiment, we have explained the case where the cover 116 is fixed onto the rotation cup 112 by means of the fitting pins 117a and the fitting recesses 117b. However, it is not necessary to employ these structures. Another fixing method can be employed. The cover 116 is fixed over the rotation cup 112 by using independently-provided urging means. If so, dust generation is overcome when the cover 116 is opened. Furthermore, the trembling of the cover 116 is successfully prevented during the rotation processing.

It is possible to position a baffle plate (not shown) in the middle position between the cover 116 and the substrate G. The baffle plate is formed of a porous plate larger than the substrate G attached to the cover 116 at the center. The presence of the baffle plate is effective to more securely prevent generation of turbulence in the process chamber during the coating process.

As shown in FIGS. 8 and 12, the solvent supply nozzle 40 is connected to a solvent tank 43 by way of a solvent supply tube 41 (serving as solvent supply passage) and an openable valve 42. When $N_2$ gas is supplied into the solvent tank 43, a solvent 11 (contained in the solvent tank 43) is supplied over the substrate G by the application of $N_2$ gas pressure. In this case, a flow amount of the solvent 11 can be regulated by controlling the pressure of $N_2$ gas. As a result, the solvent 11 can be supplied in a predetermined amount in a predetermined time period.

The resist solution supply nozzle 50 is communicated with a resist solution tank (coating solution supply source) containing a resist solution 12 by way of the resist solution supply tube 51 (serving as a resist solution supply passage). To the tube 51, a suck-back valve 53, an air operation valve 54, an air-bubble removing mechanism 55 for separating and removing air bubbles from the resist solution 12, a filter 56 and a bellows pump 57 are sequentially attached. The bellows pump 57 is expanded or contracted easily by the driving section. If the expansion and contraction movement is controlled, a predetermined amount of the resist solution 12 can be supplied (dropwise) to the center of the substrate G by way of the resist solution supply nozzle 50. The bellows pump 57 makes it possible to supply the resist solution 12 in a lower amount than a conventional case. The driving section is constituted of a ball screw mechanism 58 and a stepping motor 59. The ball screw mechanism 58 consists of a screw 58a attached to an end of the bellows pump and the associated nut 58b. The stepping motor 59 rotates the nut 58b, thereby moving the screw 58a linearly.

The diameter of the resist solution supply nozzle 50 is set depending upon the dimensions of the substrate G. In the case of the substrate G of 500×600 mm, an inner diameter is set at φ0.5 to φ05 mm, and preferably φ03 mm. As mentioned, if the diameter of the nozzle is set depending upon the dimensions of the substrate, the resist solution 12 can be supplied in as small an amount as possible for a long time. This is because, if the supply time is short, the resultant film is low in uniformity in thickness. Whereas, if the supply time is excessively long, the resist solution does not reach the peripheral edge portion of the substrate. Hence, it is preferable to set the supply time appropriately. The amount of the resist solution in this embodiment can be reduced depending upon the diameter of the nozzle 50 and the resist solution supply pressure.

In the resist coating section 30 thus constituted, the discharging time of the resist solution is controlled by how long the stepping motor 59 of the bellows pump 57 (a control accuracy: ±2 msec) is driven. The discharge amount of the resist solution 12 is set depending upon the driving operation of the bellows pump 57 such as driving time and driving speed, and an on-off operation of the air-operation valve 54 for opening/closing the resist solution supply passage. The driving time of the bellows pump 57 and the on-off operation of the air-operation valve 54 are controlled by the controller 80 on the basis of a previously set program.

Note that the discharge time of the resist solution 12 can be controlled by an on-off operation of a variable orifice (not shown) attached to the nozzle 50. Alternatively, the resist solution 12 can be supplied by pressure of $N_2$ gas generated by supplying $N_2$ gas to the resist solution tank 52, in place of the bellows pump. In this case, the discharge time of the resist solution 12 can be regulated by controlling pressure due to $N_2$ gas amount.

The suck-back valve 53 provided in the resist solution supply system plays a role in withdrawing the resist solution 12, which remains on an inner wall of the tip of the nozzle 50 due to surface tension, into the nozzle 50 after the resist solution is discharged from the nozzle 50. In this manner, the remaining resist solution can be prevented from being solidified. In the case where the resist solution supply nozzle 50 discharges a small amount of the resist solution 12, if the resist solution 12 is withdrawn into the resist solution supply nozzle 50 by use of a negative pressure of the suck-back valve 53 in a usually-employed manner, air around the tip of the nozzle 50 is inevitably sucked into together. As a result, residual materials of the resist solution 12 attached to the nozzle tip are introduced into the nozzle 50. The introduction of the residual materials causes clogging of the nozzle 50. Furthermore, the substrate G is contaminated with particles formed of dried resist. Consequently, the yield decreases. To overcome these problems, the inner wall of the tip of the nozzle near the opening thereof is rendered thick relative to the nozzle hole of the resist solution supply nozzle 50. In addition, a reverse truncated conical portion is continuously formed to the nozzle tip.

As shown in FIG. 12, a temperature controlling mechanism 61 is constituted of temperature controlling solution supply passages 62, circulation passages 63, circulating pumps 64, and thermo-modules 61. The temperature controlling solution supply passages 62 are formed so as to surround the solvent supply tube 41 and the resist supply tube 51, respectively. Each circulation passage 63 has both ends connected respectively to both side ends of the temperature controlling solution supply passage 62. The circulating pump 64 is provided at each of the circulation passages 63. The thermo-module 65 is connected to the middle of the circulation passage 63 and responsible for maintaining a temperature controlling solution (e.g. constant temperature water) at a constant temperature. The temperature controlling mechanism 61 thus constructed plays a role in controlling temperature of a solvent 11 (which flows through the solvent supply tube 41) and temperature of the resist solution 12 (which flows through the resist supply tube 51) at a desired value (e.g., about 23° C.). Note that, in FIG. 11, the nozzle 40 and the tube 41, as well as the nozzle 50 and the tube 51 are respectively formed in an integrated manner. However, these nozzles and tubes may be formed discretely.

As shown in FIG. 9, support pins 60a are allowed to protrude from one side of the upper surface of the shower head 60. When a moving arm 71 having the support pins 60a is moved in the X-axis, Y-axis and Z-axis directions by means of a moving mechanism 70, the shower head 60 having nozzles 40 and 50 are moved between an operation position (upper central portion of the substrate G) and the standby position (above the nozzle standby position 72).

In this case, four types of shower heads 60 are arranged depending upon the types of resist solutions (see FIG. 9). More specifically, four shower heads 60 are prepared in the nozzle standby position 72. The nozzles 50 of these shower heads 60 are independently communicated with tanks containing different resist solutions having different viscosity values. In this case, the resist solution supply nozzle 50 alone may be attached to each of shower heads 60, and solvent supply nozzle 40 may be previously attached to the tip of the scan arm 71. In this manner, all the shower heads 60 can commonly share the solvent supply nozzle 40. Furthermore, a plurality of solvent supply nozzles 40 may be arranged, for example, linearly, to supply the solvent simultaneously from a plurality of holes along the diameter direction of the substrate. In this case, to deal with a change in the amount of discharge, nozzles differing in diameter may be set. If so, the discharge amount from each of the nozzles can be arbitrarily controlled depending upon the change.

Note that a standby position 46 of a rinse solution supply nozzle 45 is formed at the opposite side to the nozzle standby position 72 (see FIG. 9). A washing nozzle 47 is arranged in an un-rotatable connecting cylinder 131 which is fixed at the lower portion of the rotation cup 112. It is therefore possible to wash an inner surface of the rotation cup 112 and the cover 116. To explain more specifically, the washing nozzle 47 is supported by a bracket 48 attached to the rotation shaft 122, the washing solution supply pipe 49 connected to the washing nozzle 47 is communicated with a washing solution supply source (not shown) in the outside via a passage formed in the fixed collar 124. With this structure, when the spin chuck 10 is raised as indicated by a two-dot line in FIG. 10, the washing nozzle 47 is allowed to appear between the spin chuck 110 and the bottom of the rotation cup 112. In this manner, the washing solution is allowed to spray onto the inner surface of the rotation cup 112 and the cover 116 under rotation.

Now, referring to FIGS. 13 to 18, the peripheral resist removing section 31 of the unit 24 will be explained.

A table 334 is arranged at the center of the peripheral resist removing section 31. The table 334 is supported by being connected to an upper end of a support 333. The upper surface of the table 334 is equipped with adsorption members 335a to 335h. The rear surface of the substrate G is adsorbed by the adsorption members 335a to 335h.

The support 333 passes through a bearing 337 fixed on the apparatus frame 336. When the support 333 slides within the bearing 337, the table 334 is moved up and down together with the support 333. However, the support 333 is connected to a piston rod 339 of a cylinder 338 fixed on the apparatus frame 336 by means of a connecting member 340. In addition, the bearing 337 and a cover 341 covering the cylinder 338 are connected to the piston rod 339. Hence, the table 334 is moved up and down together with the cover 341 by expansion or contraction of the cylinder 338. By this movement, the substrate G is loaded/unloaded into/from the peripheral resist removing section 331.

A drain pan 345 is arranged below the substrate G. The drain pan 345 is responsible for receiving dropped solvent and resist solution used at the time the peripheral resist film of the substrate G is removed. A side wall member 346 is provided so as to surround the drain pan 345 to prevent the atmosphere of the drain pan 345 from leaking. The drain pan 345, in the figure, is arranged so as to surround the driving portion of the table 334 including the aforementioned bearing 337 and the cylinder 338. A drain pipe 348 is connected to a bottom surface 47 of the drain pan 345, for discharging the solvent received and stored by the drain pan 345. An evacuation system (not shown) is connected to the drain pipe 348. An inner atmosphere of the peripheral resist removing section 31 is evacuated by evacuating means (not shown). Furthermore, air is sucked by an independent fine filter unit (not shown) to thereby generate a down-flow of air around the substrate G.

As shown in FIG. 14, four nozzles 355, 356, 357, 358 are movably arranged respectively along four sides of the substrate G held on the table 334.

In this embodiment, first and third nozzles 355, 357 are arranged movably along short sides L1, L3 of the substrate G so as to face each other. Second and fourth nozzles 356, 358 are arranged movably along long sides L2, L4 of the substrate G so as to face each other. These nozzles 355, 356, 357, 358 are fitted respectively onto tips of L-shaped moving members 360, 361, 362, 363, as shown in FIG. 14. Guide rails 365, 366, 367, 368 are arranged so as to surround the substrate G and are fixed onto the apparatus frame 336. The moving members 360, 361, 362, 363 are slidably fitted respectively on the guide rails 365, 366, 367, 368. It is therefore possible for the nozzles 355, 356, 357, 358 to move along four sides L1, L2, L3, L4, respectively.

Next, referring to FIG. 15, we will explain a first nozzle 355 on behalf of the other nozzles since the nozzles 355, 356, 357, 358 have substantially the same structure as the first nozzle 355.

The nozzle 355 has a shower head 372 having a reverse C shaped cross-sectional area. The shower head 372 consists of an upper horizontal piece 370 overhanging the upper surface of the peripheral edge portion of the substrate G and a lower horizontal piece 371 projecting outward from the upper horizontal piece 370. The upper horizontal piece 370 includes a thinner supply passage 373 passing within the upper horizontally-placed piece 370, and an upper spray hole 374 for supplying a thinner (removing solution) toward the upper surface of the peripheral edge portion of the substrate G by way of the thinner supply passage 373. The lower horizontal piece 371 includes a thinner supply passage 375 passing through the lower horizontal piece 371 and lower spray holes 376 for supplying a thinner (resist-removing solvent) toward a lower surface of the peripheral edge portion of the substrate G by way of the thinner supply passage 375. Furthermore, the shower head 372 has a slit 377 formed so as to cover around the peripheral edge portion of the substrate G. Suction holes 378 are provided inside at the middle portion for exhausting atmosphere around the peripheral edge portion of the substrate G to the outside.

Next, referring to FIG. 16, the adsorption members 335a to 335h for adsorbing and holding the substrate G will be explained.

The adsorption members 335a, 335c, 335e, 335g are respectively arranged at four corners of the upper surface of the table 34. The adsorption member 335b is positioned at a mid point of the adsorption members 335a and 335c. The adsorption member 335d is positioned at a mid point of the adsorption members 335c and 335e. In the same manner, the adsorption member 335f is positioned between the adsorption members 335e and 335g, and the adsorption members 335h between the adsorption members 335g and 335a. In the exemplified case shown in the figure, the adsorption members 335a to 335c are arranged along a short side L3 of the substrate G. The adsorption members 335c to 335e are arranged along a long side L2 of the substrate G. In the same manner, the adsorption members 335e to 335g are arranged along a short side L1 and the adsorption members and 335g to 335a along a long side L4 of the substrate G.

Now, the adsorption members 335a to 335h will be explained in detail with reference to FIGS. 17 and 18.

Eight adsorption members 335a to 335h are substantially equal. Hence, only the adsorption member 335a will be explained on behalf of them. As shown in FIG. 17, the adsorption member 335a has a vacuum hole 380 and an oil seal 384. The vacuum hole 380 vertically extends through the table 334 and communicates with a vacuum-suction apparatus 390 by way of a communication passage 391a as shown in FIG. 18. The oil seal 384 is fixed in a stepped recess 381 of the outer periphery of the vacuum hole 380 by means of an urge ring screw 383 via a packing 382. A seal portion 385 is provided in the upper surface of the oil seal 384. The seal portion has a shape spreading upwardly and outwardly. Furthermore, the adsorption member 335a has a top pad 387 having a suction hole 386 at the center thereof. The adsorption member 335a is movably engaged with the seal portion 385 of the oil seal 384.

As shown in FIG. 18, each of the adsorption members 335a to 335h is communicated with the vacuum suction apparatus 390 by way of the corresponding communication passages 391a to 391h. The vacuum suction apparatus 390 maybe turned on throughout operation. The communication passages 391a to 391h are equipped respectively with the corresponding openable valves 392a to 392h. Each of the power supply switches for 392a to 392h is connected to an output side of the control section 393. The openable valves 392a to 392h are respectively opened/closed at a predetermined timing. The control section 393 has a memory portion and a CPU. The memory portion is responsible for storing open/shut timing data for the openable valves 3902a to 392h. The CPU is responsible for sending an instruction signal to power supply switches for the openable valves 392a to 392h. To explain more specifically, when the first openable valve 392a is opened, the communication passage 391a is suctioned by a vacuum suction apparatus 390. As a result, the first adsorption member 335a is adsorbed onto the rear surface of the substrate G.

According to the open/shut timing data, all adsorption members 335a to 335h are not involved in adsorption operation at the same time. All eight adsorption members 335a to 335h may be adsorbed either singly or in a group combining two or more members. In the open/shut timing data of this embodiment, adsorption members responsible for adsorption operation are divided into four group: a first pair of adsorption members 335a and 335e, a second pair of adsorption members 335b and 335e, a third pair of adsorption members 335c and 335g, and a fourth pair of adsorption members 335d and 335h, each being arranged symmetrically. These four groups are sequentially operated by switching one to another pair at predetermined time intervals.

Figure 19:
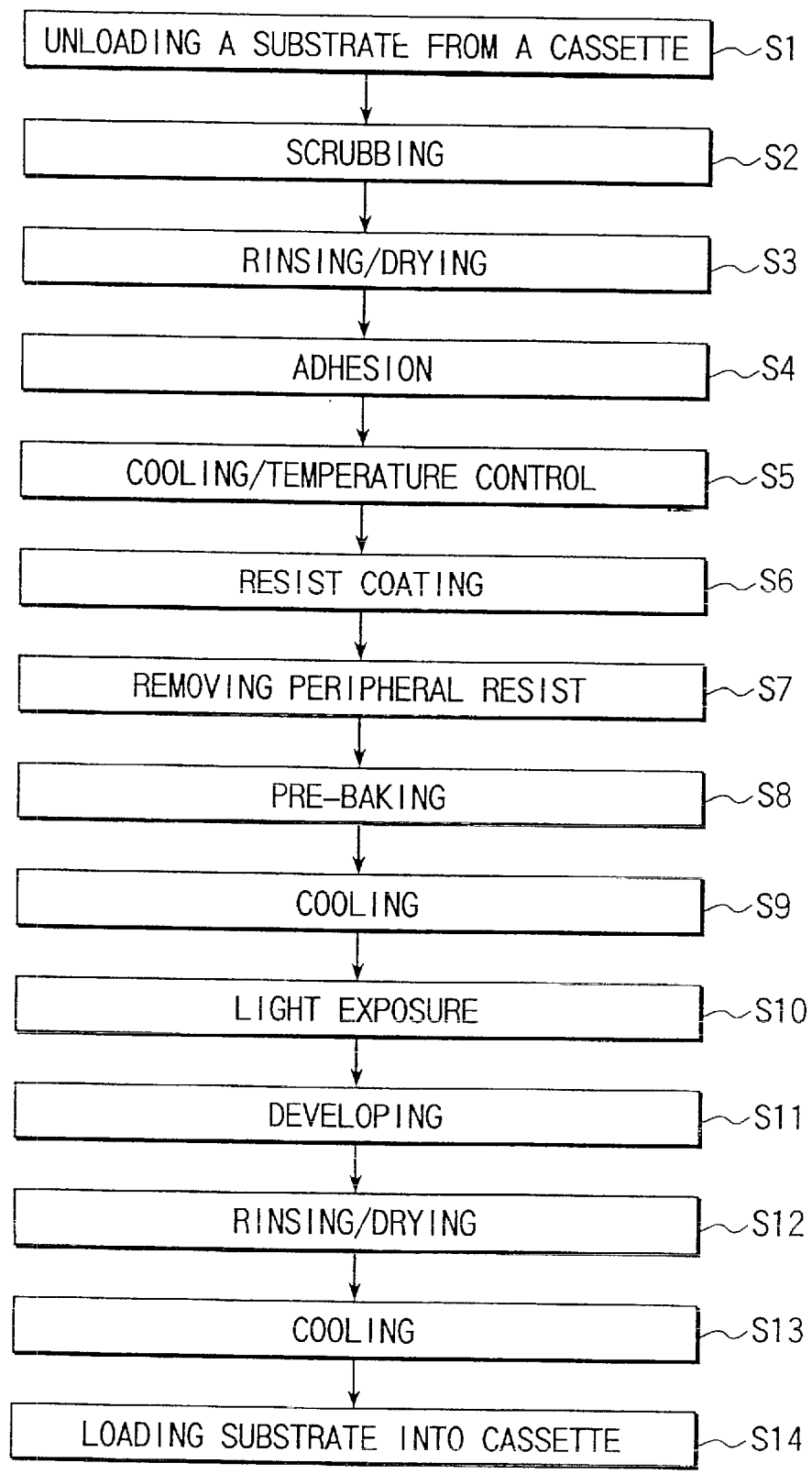
FIG. 19 is a flow chart showing an example of a photolithographic process of an LCD substrate.
Figure 20:
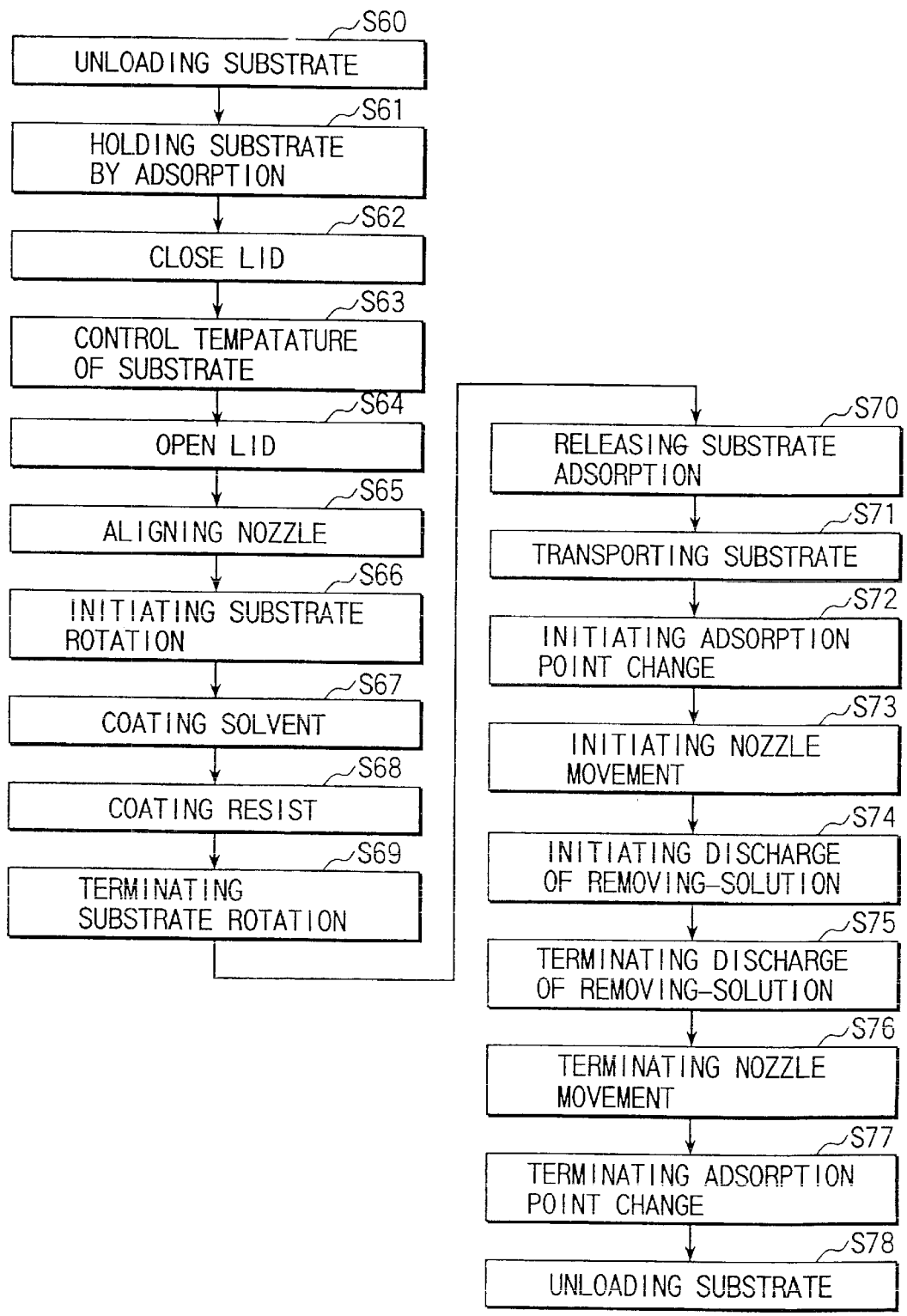
FIG. 20 is a flow chart showing a substrate processing method according to an embodiment of the present invention.

Now, with reference to FIGS. 19 and 20, we will explain a series of resist processing processes for an LCD substrate G.

A single substrate G is unloaded from a cassette C1 by a sub transfer arm 13 (Step S1). The substrate G is transferred from the sub transfer arm 13 to a first main transfer arm 15 and further transferred from the main transfer arm 15 into a scrub unit 17, in which the substrate G is scrubbed (Step S2). The substrate G is subsequently rinsed with pure water and heated to dry (Step S3).

Then, the substrate G is transferred to an adhesion unit 19 by the first main transfer arm 15. In the adhesion unit 19, an HMDS steam is applied to the surface of the substrate G while heating the substrate G. In this way, the surface of the substrate G is rendered hydrophobic (Step S4). Thereafter, the substrate G is transferred to a second main transfer arm 22 by the first main transfer arm 15. The second main transfer arm 22 transfers the substrate G to a cooling unit 21.

Now, we will explain the case where temperature of the substrate G is controlled by cooling in the cooling unit 21.

The substrate G is inserted together with a holder of the main transfer arm into the cooling unit 20 through an opening 261. The lift pins 270 are allowed to project upward to thereby transfer the substrate G from the holder onto the lift pins 270. The holder of the main transfer arm is withdrawn from the cooling unit 21, and then the lift pins 270 are descended to transfer the substrate G to a table 266 of a lower cooling mechanism 265. Thereafter, while a coolant is supplied to an inner flow path 284, cool air is allowed to blow down from a ventilation port 263 of an upper cooling mechanism 262 and cool air is allowed to blow sideward from holes 268 of the middle cooling mechanism 267. As a result, the lower surface (rear surface) of the substrate G is controlled in temperature by the table 266 and the upper surface (front surface) of the substrate G is controlled in temperature by the cool air (Step S5).

In the step S5, an inner atmospheric temperature of the coating unit 30 is detected by the temperature sensor 25. The cool air generator 280 and a coolant supply source 282 of the cooling unit 21 are respectively controlled on the basis of the detection temperature and a preset process target $T^P$. More specifically, the controlling operation is as follows:

In the case where the detection temperature (24° C.) of the coating unit 30 is higher than a process target temperature (23° C.), the temperature $T^P$ of the cooling unit 21 during the cooling processing is set at 20° C. Whereas, in the case where the detection temperature (22° C.) is lower than the process target temperature $T^P$ (23° C.), the temperature of the cooling unit 21 during the cooling operation is set at 19° C. The process target temperature $T^P$ used herein is set on the basis of the temperature/film thickness data previously obtained by forming a coating film on the substrate.

As a result of the intensive studies conducted by the present inventors, it was found that if the regional difference in temperature of the coating film until the coating film is cured, is 1.5° C. or more, the so-called "indirectly influenced mark" is produced. Therefore, the controller 80 controls each of the temperature controlling means, in consideration of the difference in detection accuracy of the sensor, in such a way that the differences in temperature between the substrate G ($T^H$) and the contact substrate G ($T^H$) and the resist solution ($T^R$) fall within ±1° C. To obtain a desired resist coating film, it is necessary to satisfy the following relationships (1) and (2):

$$T^T-1 \leq T^H \leq T^T+1 \tag{1}$$

$$T^R-1 \leq T^H \leq T^R+1 \tag{2}$$

where $T^H$ is a temperature (°C.) of the substrate G. $T^R$ is a temperature of a resist solution (°C.), and $T^T$ is a temperature of contact members (e.g. spin chuck).

Note that the temperature $T^T$ of the contact members such as the spin chuck 110 varies depending upon ambient temperature $T^A$ therearound. For this reason, when the ambient temperature $T^A$ changes, the temperature $T^T$ is assumed to change. Both $T^H$ and $T^R$ are changed so as to satisfy the equations (1) and (2) mentioned above.

Each of cooling mechanisms 280 and 282 of the cooling unit 21 are separately controlled on the basis of the temperature data (atmospheric temperature $T^A$ of the coating unit 30) detected by the temperature sensor 25. It is therefore possible to swiftly control the temperature of the substrate G immediately before resist coating, in accordance with the change in inner atmospheric temperature $T^A$ of the coating unit 30. Hence, even if each of processing units is relatively large, temperature can be controlled accurately and efficiently in a short time.

After completion of the cooling operation of the substrate G, the substrate G is unloaded from the cooling unit 21 by a second main transfer arm 22 and transferred to the coating unit 30 of the coating/peripheral edge portion removing unit 24. The substrate G is loaded into the coating section 30 of the apparatus 24 by the second main transfer arm 22 and then mounted on the spin chuck 110 (Step S60). The substrate G is adsorbed and held on the spin chuck 110 (Step S61). Note that the spin chuck 110 is controlled at an appropriate temperature before the step 61.

A lid 116 is closed to keep the inside of the cup 112 airtight (Step S62). Temperature of the substrate G is controlled by a spin chuck (Step S63). Since no air flow is generated within the cup 112, difference in temperatures of the substrate G is reduced. As a result, the substrate has a virtually uniform temperature distribution. Then, the lid 116 is opened (Step S64).

The shower head 60 is moved from a home position to an operation position to position the nozzles 40, 50 right upon almost the center of the substrate G (Step S65). The thinner flowing through the nozzle 40 is controlled at an appropriate temperature on the basis of the process target temperature and the atmospheric temperature of the process space. The resist solution flowing through the nozzle 50 is controlled at the appropriate temperature on the basis of the process target temperature and the atmospheric temperature of the process space. Spin-rotation of the substrate G is initiated together with the spin chuck 110 (Step S66). While the substrate G is spin-rotated, thinner 11 is allowed to discharge from the solvent nozzle 40 to apply thinner 11 on the surface of the substrate G (Step S67). Then, the nozzle 50 is aligned with the substrate G. The resist solution 12 is allowed to discharge from the nozzle 50 to supply the resist solution 12 on the surface of the substrate G. Subsequently, the lid 116 is closed to keep the inside of the cup 112 airtight and the substrate G and the resist solution 12 are rotated in a synchronous manner to disperse the resist solution on the substrate, thereby forming the resist coating film in a uniform thickness (Step S68). Since substantially no air flow is generated around the substrate G by rotating the cup/substrate in a synchronous manner, the occurrence of the regional difference in temperature of the coating film formed on the substrate G can be prevented. The rotation of the substrate is terminated and the lid 116 is removed (Step 69). Furthermore, the adsorption of the substrate G by the spin chuck 110 is canceled (Step S70). Through this series of steps S60 to S70, a resist film is formed in a desired thickness on the upper surface of the substrate G (Step S6). The Peltier element is also buried in the chuck 32b of the transfer mechanism 32. The chuck 32b is controlled in temperature on the basis of the process target temperature and the atmospheric temperature of the process space.

Figure 13:
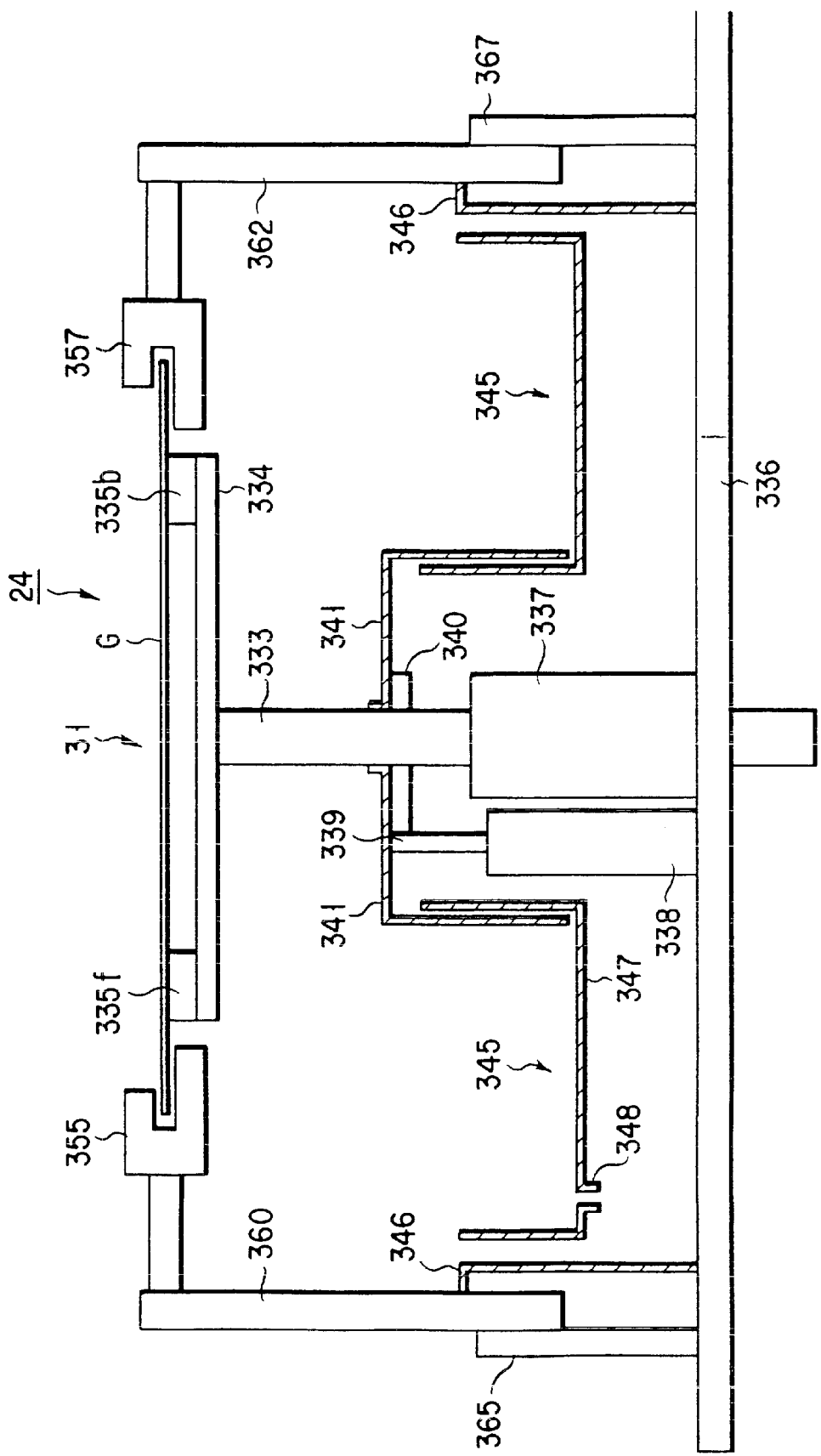
FIG. 13 is a fragmentary sectional side view of a peripheral-resist removing apparatus.

Then, the substrate G is transported from the resist coating section 30 to the peripheral resist removing section 31 by the transfer mechanism 32 (Step S71). In the peripheral resist removing section 31, when the substrate G is loaded, the table 334 is moved up by the cylinder 338 to transfer the substrate G from the holder of the main transfer arm onto the table 334, and the rear surface of the substrate G is adsorbed by the adsorption member 334. After the transfer mechanism 332 is withdrawn from the peripheral resist removing section 31, the table 334 is descended to position as shown in FIG. 13.

In the peripheral resist removing section 31, adsorption sites of the substrate G on the table 334 are sequentially changed by controlling sucking operation of the vacuum adsorption apparatus 390, at the same time, the nozzles 355, 356, 357, 358 are moved respectively along four sides L1, L2, L3, L4 while discharging thinner 11, thereby removing resist attached in the peripheral edge of the substrate G (Steps S7 and S72–S77).

As shown in FIG. 15, the peripheral edge portion of the substrate G is inserted in the slit 377 so as not to contact each of the constitutional elements of the nozzles 355, 356, 357, 358. Under the conditions, the slit 377 is evacuated by way of the suction hole 378, at the same time, the adsorption operation is initiated to control the adsorption members 335a to 335h for switching the adsorption sites of the substrate G (Step S72). Subsequently, the movement of each of the nozzles 355, 356, 357, 358 is initiated (Step S73) and spray of thinner is initiated from the upper spray hole 374 and the lower spray holes 376 (Step S74). In this manner, resist removal of the peripheral edge portion of the substrate G is started.

When each of the nozzles 355, 356, 357, 358 reaches the end of the corresponding sides L1, L2, L3, L4, spray of thinner from the upper spray hole 374 and the lower spray holes 376 is terminated (Step S75); at the same time, the movement of each of the nozzles 355, 356, 357, 358 is terminated (Step S76). Furthermore, the switching of adsorption sites of the substrate by the adsorption members 335a to 335h is canceled (Step S77).

The table 334 is ascended to pick the substrate G up from the table by the main transfer arm 22 and unloaded from the coating/peripheral edge portion removing unit 24 (Step S78).

The substrate G is transported to the baking unit 20 by the main transfer arm 22 and pre-baked at a predetermined temperature (Step S8). The substrate G is cooled in the cooling unit 21 (Step S9). The substrate G is loaded into the light-exposure apparatus 6 via the interface section 7. The resist coating film is pattern-exposed by the light exposure apparatus 6 (Step S10). Then, the substrate G is transported to the developing unit 18. The resist coating film is developed with a developing solution (Step S11). Furthermore, the substrate G is rinsed with pure water and heated to dry (Step S12). The substrate is further cooled in the cooling unit 21 (Step S13). The treated substrate G is transferred from the main transfer arm 15 to the sub transfer arm 13 and stored in the cassette C2 of the loader section 2 by the sub transfer arm (Step S14). Finally, the cassette C2 storing the substrate G is unloaded from the system 1 and transported to an processing apparatus for next step.

In the peripheral resist film removing step mentioned in the foregoing, the adsorption members 335a to 335h provided on the table 334 play an important role in leaving no "indirectly influenced mark" on the rear surface of the substrate G. However, all adsorption members 335a to 335h do not always participate in adsorption operation. Some members are appropriately selected from the adsorption members 335a to 335h in a predetermined order and participate in the adsorption operation. The adsorption operation by firstly selected members is terminated before the "indirectly influenced mark" is left and another adsorption operation by secondly selected members is initiated. In this way, the substrate G is held on the table 334 by migrating the adsorption sites on the rear surface of the substrate G. For example, the following switching operation is performed in steps S73–S77.

Of the adsorption members 335a to 335h, point-symmetrically arranged members are grouped so as to function simultaneously. More specifically, the adsorption members 335a/335e, 335b/335f, 335c/335g, and 335d/335h are coupled. When the adsorption members 335a/335e are operated, the control section 393 sends a control signal to openable valves 392a and 392e. Similarly, when the adsorption members 335b/335f, 335c/335g and 335d/335h are used, the signal is sent respectively to the openable valves 392b/392f, 392c/392g, and 392d/392h. In this manner, the substrate G is adsorbed at two points on the rear surface thereof with a center of the substrate G interposed between them. The substrate G is therefore held on the table 334 constantly and securely during the processing.

Hereinafter, we will explain the adsorption operation of the members 335a/335e on the behalf of other members 335b/335f, 335c/335g, and 335d/335h since they function equally.

When a control signal is sent from the control section 393 to the openable valves 392a, 392e, the openable valves 392a, 392e are opened together and the adsorption members 335a, 335e function synchronously to adsorb the substrate G. Conversely, when no control signal is sent from the control section 393 to the openable valves 392a, 392e, the openable valves 392a, 392e are closed together, with the result that the substrate G is not adsorbed by the adsorption members 335a/335e. The operation of the adsorption members 335a/335e is synchronously controlled by the control section 393. The members 335b/335f, 335c/335g, and 335d/335h are synchronously controlled by the control section 393 in the same manner as the adsorption members 335a/335e.

The adsorption time by the adsorption members 335a to 335h is set within a predetermined time period so as to lower than the processing time applied to the substrate G. This is made to prevent the indirectly influenced mark from appearing on the rear surface of the substrate G before happening. This is because if adsorption by the adsorption members 335a to 335h is continued in excess of the predetermined time, "indirectly influenced mark" remains on the substrate G. In this case, the control section 393 sends a signal periodically to one of groups of the openable valves 392a to 392h. Other groups of the openable valves do not receive the signal. Therefore, the adsorption members 335a to 335h are divided into groups involved or not involved in the adsorption operation. The group appropriately selected from the group of the adsorption members 335a to 335h executes adsorption operation for a predetermined time. After the adsorption operation by this group is completed, another group selected from the groups of the adsorption members 335a to 335h plays a part in the adsorption operation. After this group executes adsorption operation for a predetermined time, the aforementioned procedure is subsequently repeated until all members participate. The adsorption sites on the rear surface of the substrate G are not fixed. In this manner, the substrate G is always held on the table 334 during processing operation without leaving the "indirectly influenced mark" of the adsorption members 335a to 335h on the rear surface of the substrate G. After a group of the adsorption members 335a to 335h once participates in the adsorption operation for a predetermined time, the group is not prohibited from participating in the same operation and can participate in the adsorption operation at an appropriate time interval.

Next, referring to FIGS. 21A to 21D, how to switch the adsorption sites of the substrate G will be explained. In the figures, a solid circle schematically represents an ON state and an open circle represents an OFF-state.

Figure 21A:
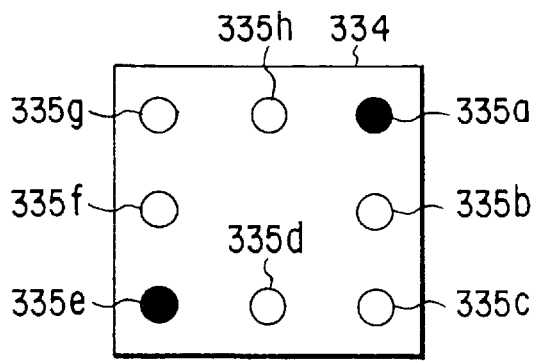
FIGS. 21A, 21B, 21C, and 21D are schematic views showing switching movements of the adsorption sites, respectively.
Figure 21B:
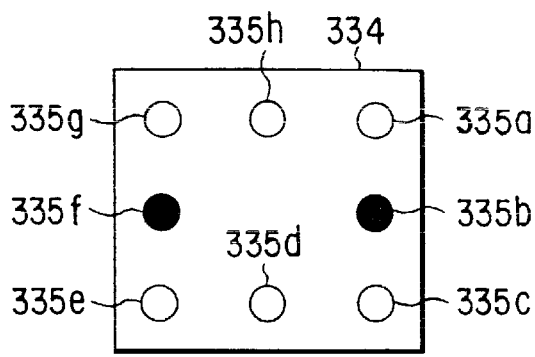
Figure 21C:
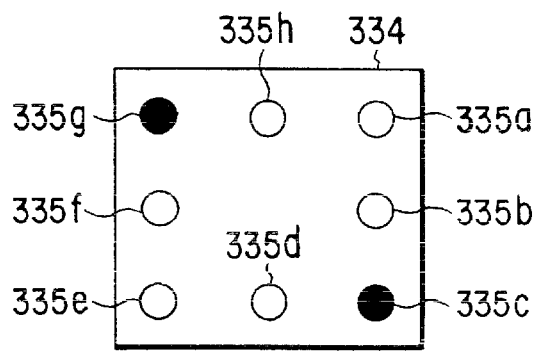
Figure 21D:
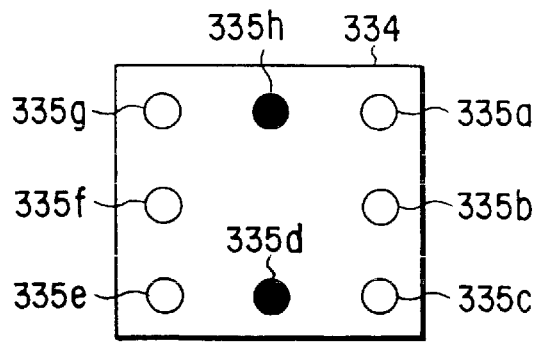

The adsorption sites of the substrate G by the adsorption members 335a to 335h are sequentially switched counter-clockwise in this embodiment. As shown in FIG. 21A, the adsorption operation is started with the adsorption member 335a on one hand. On the other hand, the adsorption operation is started with the adsorption member 335e, synchronously. After a predetermined time is passed, the adsorption members 335a and 335e are simultaneously terminated and then the adsorption operation of the adsorption members 335b and 335f is simultaneously initiated, as shown in FIG. 21B. After the passage of a further predetermined time, the operation of the adsorption members 335b and 335f is simultaneously terminated, and the operation of the adsorption members 335c and 335g is simultaneously initiated, as shown in FIG. 21C. After a further predetermined time, the operation of the adsorption members 335c and 335g is simultaneously terminated, and the operation of the adsorption members 335d and 335h is simultaneously initiated, as shown in FIG. 21D. Still in a predetermined time, the operation is returned to the state shown in FIG. 21A. Thereafter, a series of switching operations mentioned above is repeated. As described, the substrate G is adsorbed at two points symmetrically arranged with respect to a center of the substrate G. In addition, the adsorption sites are regularly switched. It is therefore possible to hold the substrate G further securely.

In the adsorption-position switching operation mentioned above, timing for switching from a preceding group to a following group can be varied in various ways. For example, the adsorption operation of the preceding adsorption group (e.g., first group 335a, 335e) is terminated, at the same time, the operation of the following group (e.g., second group 335b/335f) may be initiated. Alternatively, before the adsorption operation by the preceding group (e.g., third group 335c/335g) is terminated, the adsorption operation by the following group (e.g., fourth group 335d/335h) may be initiated.

Note that a combination of two adsorption members is not necessarily involved in synchronously-operated adsorption operation. Three or four or more members may serve as one group in the synchronously-operated adsorption operation. As an extreme example, adsorption members 335a to 335h except only one member may be involved in the adsorption operation and the adsorption operation may be switched by subsequently changing to the only-one member.

According to the aforementioned embodiment, the adsorption time occupied by each of the adsorption members 335a to 335h is reduced since the adsorption sites on the substrate G can be switched sequentially. It is therefore possible to prevent the "indirectly influenced mark" due to the adsorption members 335a to 335h from remaining on the rear surface of the substrate G. As a result, the number of defective final products, (substrate G) can be reduced, improving the yield.

Figure 22:
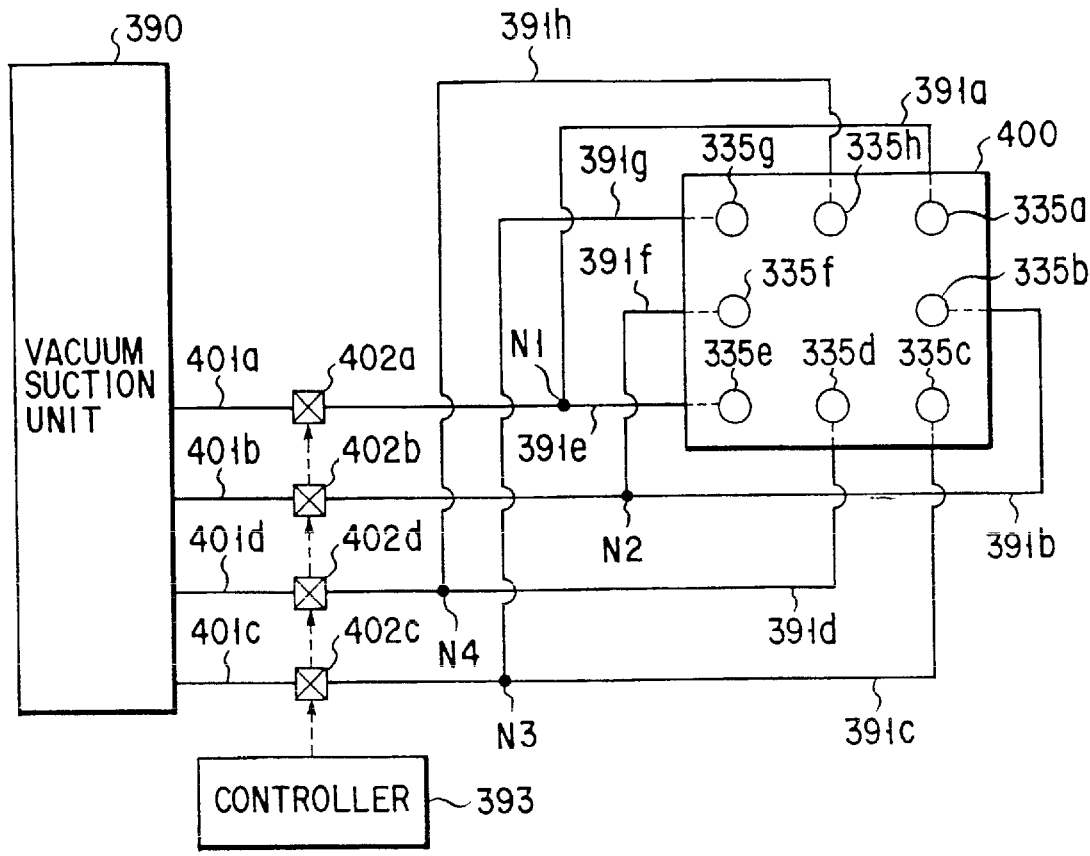
FIG. 22 is a block circuit diagram showing a exhaust circuit of an adsorption site.

In the foregoing, an embodiment of the present invention has been explained. However, the present invention is not limited to this embodiment. The embodiment may be modified in various ways. For example, as shown in FIG. 22, the suction passage 391a for the adsorption members 335a and the suction passage 391e for the adsorption members 335e (point-symmetrically positioned to the members 335a with the center of the table 400 interposed therebetween) are partially connected in common. In the same manner, the passage 391b (for the member 335b) and the passage 391f (for the member 335f), the passage 391c (for the member 335c) and the passage 391g (for the member 335g), and the passage 391d (for the member 335d) and the passage 391h (for the member 335h) may be partially connected. In this case, the suction passages 391a and 391e are connected at a point N2. An openable valve 402a is provided in the middle to the suction passage 401a connected between the connecting point N2 and the vacuum suction apparatus 390. In the same manner, suction passages 391b and 391f are connected at a point N2. An openable valve 402b is provided in the middle of the suction passage 401b which connects the connecting point N2 and the vacuum suction apparatus 390.

Similarly, suction passages 391c and 391g are connected at a point N3. An openable valve 402c is provided in the middle of the suction passage 401c which connects the connecting point N3 and the vacuum suction apparatus 390. Furthermore, suction passages 391d and 391h are connected at a point N4. An openable valve 402d is provided in the middle of the suction passage 401d which connects the connecting point N4 and the vacuum suction apparatus 390.

According to the circuit mentioned above, the adsorption operation mediated by two adsorption members selected from the adsorption members 335a to 335h can be controlled by operating only one valve of the openable valves 402a to 402d. To be more specific, the suction passages 390a and 390e are initiated or terminated communication with the vacuum suction apparatus 390 by only operating the openable valve 402a. As a result, the adsorption operation by adsorption members 335a and 335e is controlled. By virtue of this construction, it is possible to reduce the number of openable valves while the adsorption members 335a to 335h on the table 400 are routinely operated, with the result that the load of the control section 393 for controlling the openable valves 402a to 402d is reduced. At the same time, the structure of the table 400 can be simplified.

Figure 23:
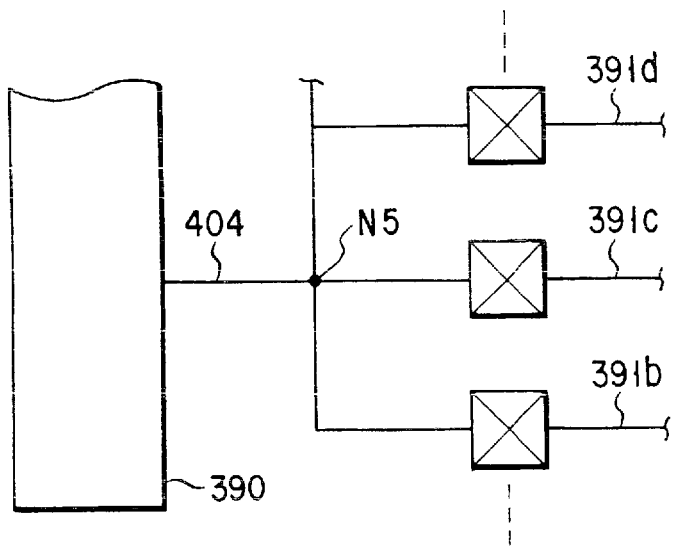
FIG. 23 is a block circuit diagram showing a gist portion of the exhaust circuit of another adsorption-site.
Figure 24A:
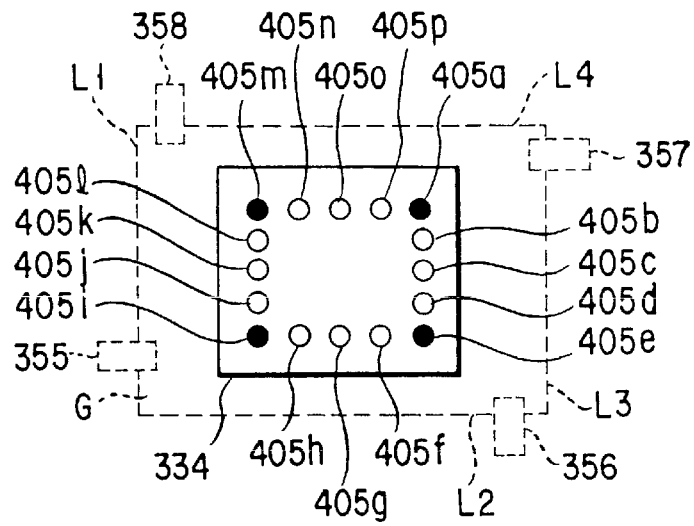
Figure 24B:
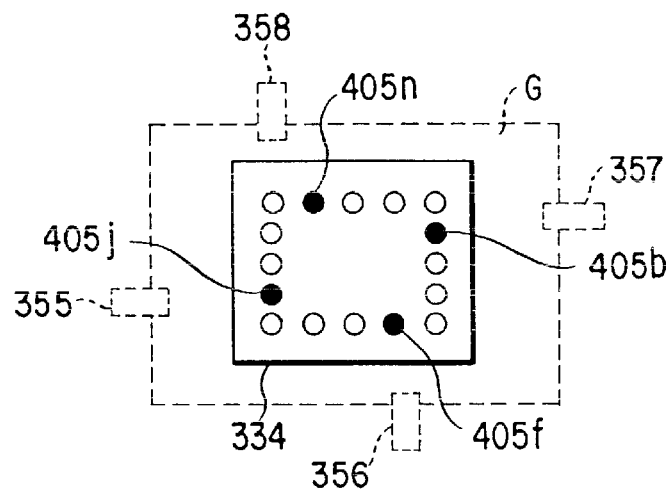
Figure 24C:
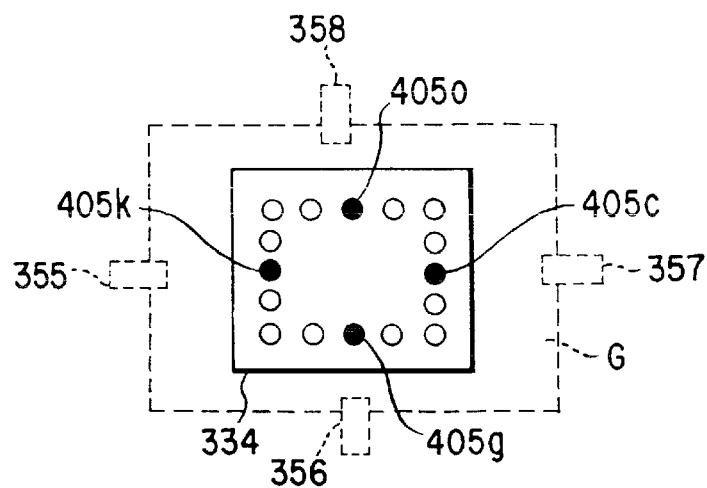

As shown in FIG. 23, all of the suction passages 391a to 391h may be connected to a connecting point N5. If the connection point N5 is further connected to the suction passage 404, which connects and the vacuum suction apparatus 390. In this way, the suction passages 391a to 391h may be connected to the vacuum suction apparatus 390. According to such a construction, it is possible to omit a step of connecting each of the suction passages 391a to 391h to the vacuum suction apparatus 390.

In the aforementioned switching adsorption process, various embodiments can be considered. The adsorption operation may be switched counter-clockwise. Alternatively, the adsorption operation is not always switched regularly (e.g., clockwise or counter-clock wise) and may be switched irregularly.

As shown in FIGS. 24A to 24E, when the resist solution 12 is supplied to the substrate G while the nozzles 355, 356, 357, 358 are being moved along the corresponding peripheral edge of the substrate G, the adsorption members 405a to 400p may be sequentially moved with the movement of the nozzles 355, 356, 357, 358. In this case, adsorption members 405a, 405e, 405i and 405m are arranged respectively at four corners of the table 334. The adsorption members 405b, 405c, 405d are arranged at appropriate intervals between the adsorption members 405a and 405e. In the same manner, the adsorption members 405f, 405g, 405h are arranged at appropriate intervals between the adsorption members 405e and 405i. Similarly, the adsorption members 405j, 405k, 405l are arranged at appropriate intervals between the adsorption members 405i and 405m. Furthermore, the adsorption members 405n, 405o, 405p are arranged at appropriate intervals between the adsorption members 405m and 405a. In the embodiment shown in the figure, the adsorption members 405a to 405e are aligned along a short side L3 of the substrate G. The adsorption members 405e to 405i are aligned along a long side L2 of the substrate G. The adsorption members 405i to 405m are aligned along a short side L1 of the substrate G. The adsorption members 405m to 405a are aligned along a long side L4 of the substrate G.

Now, the aforementioned apparatus will be further explained with reference to FIGS. 24A to 24E.

In the short side L1, with the movement of the first nozzle 355 along the short side L1 of the substrate G, the adsorption operation is switched in the order from adsorption members 405i to 405m. In the long side L2, with the movement of the second nozzle 356 along the long side L2 of the substrate G, the adsorption operation is switched in the order from adsorption members 405f to 405i. In the short side L3, with the movement of the third nozzle 357 along the long side L3 of the substrate G, the adsorption operation is switched in the order from adsorption members 405a to 405e. In the long side L4, with the movement of the fourth nozzle 358 along the long side L4 of the substrate G, the adsorption operation is switched in the order from adsorption members 405n to 405a.

According to the switching adsorption process, the substrate G is securely adsorbed at a rear surface corresponding to the peripheral portion of the upper surface, from which the resist film has been removed by the nozzles 355, 356, 357, 358. The resist film can be therefore smoothly removed from the peripheral resist film. Furthermore, adsorption members 405a to 405p responsible for adsorption operation may be sequentially moved in the reverse direction of the nozzle movement.

The substrate is not limited to an LCD substrate G. Use may be made of a semiconductor wafer, a glass substrate, a CD substrate, a photomask, a print substrate, a ceramic substrate and the like.

It is possible to control the chuck temperature controller and the coating solution controller on the basis of the temperature of the coating unit 30. Furthermore, two or three items selected from cooling temperature controllers of the cooling unit 21, the chuck temperature controller and the coating solution temperature controller may be controlled on the basis of the detected temperature of the coating unit 30.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of processing a rectangular substrate for forming a resist film on the substrate for use in a liquid crystal display comprising steps of:

(a) mounting the substrate on temperature controlling means which is capable of having a thermal influence on the substrate, and controlling temperature $T^H$ of the substrate by exerting a thermal influence upon the substrate from upper and lower surfaces thereof;

(b) controlling temperature $T^R$ of a resist solution to be supplied to the substrate;

(c) controlling at least one temperature $T^T$ of a support member selected from the group consisting of temperatures of a plurality of chucks coming into contact with the substrate when the substrate is transported, temperatures of a plurality of supporting pins coming into contact with the substrate when the substrate is lifted up from said temperature controlling means and temperatures of adsorption members coming into contact with the substrate when the substrate is held by vacuum adsorption;

(d) detecting temperature $T^A$ of an atmosphere of a process space for applying the resist solution to the substrate, said temperature $T^A$ detected at a sensor located in a discharge passage;

(e) setting a process target temperature $T^P$ for forming a resist film on the substrate;

(f) controlling said temperature $T^H$ by controlling operation of at least step (c) on the basis of the process target temperature $T^P$ set in the step (e) and the temperature $T^A$ detected in the step (d); and (g) applying the resist solution to the substrate held rotatable and substantially horizontal by said support member, the substrate being surrounded by a rotary cup and a cover being disposed on said rotary cup to form a substantially closed space around the substrate, and the substrate and the rotary cup being rotated within said closed space to form a resist film on the substrate.

2. The method according to claim 1, wherein, in the step (g), a solvent additionally controlled in temperature in the step (b) is applied to the substrate, said solvent capable of dissolving the resist solution.

3. The method according to claim 1, wherein, in the step (c), said support member is a spin chuck for rotatably holding the substrate or a plurality of adsorption members for attracting the substrate.

4. The method according to claim 3, wherein, in the step (c), the process space surrounding the substrate mounted on the spin chuck is closed.

5. The method according to claim 1, further comprising a step (h) of setting temperature controlling conditions which provide a constant relationship between a temperature $T^T$ (°C.) for the support member in contact with the substrate, a temperature $T^H$ (°C.) of the substrate, temperature $T^R$ (°C.) of the resist solution, and a temperature $T^A$ (°C.) of the atmosphere within the process space in a period from said step (a) until the resist film is cured, said constant relationship satisfying:

$$T^T - 1 \leq T^H \leq T^T + 1$$

$$T^R - 1 \leq T^H \leq T^R + 1.$$

6. The method according to claim 1, further comprising after the step (g) the step of applying a solvent to a peripheral portion of the substrate, which is held by a plurality of suction members sucking the back surface thereof, to dissolve and remove the resist film from the peripheral portion of the substrate.

7. The method according to claim 1, wherein, in step (c), each of said chucks is cooled.

8. The method according to claim 1, wherein each of said supporting pins has a tip portion form of a resin.

* * * * *